(12) United States Patent
Nakashima et al.

(10) Patent No.: US 7,640,388 B2
(45) Date of Patent: Dec. 29, 2009

(54) FILE STORAGE APPARATUS FOR STORING FILE DATA AND MANAGEMENT INFORMATION

(75) Inventors: Katsuya Nakashima, Nagasaki (JP); Hideki Hara, Kanagawa (JP); Takashi Akai, Tokyo (JP); Toshifumi Nomura, Kanagawa (JP); Kazumi Sato, Kanagawa (JP); Yukihisa Tsuneda, Kanagawa (JP); Toshiyuki Nishihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 391 days.

(21) Appl. No.: 10/961,299

(22) Filed: Oct. 8, 2004

(65) Prior Publication Data
US 2005/0080762 A1  Apr. 14, 2005

(30) Foreign Application Priority Data
Oct. 10, 2003  (JP)  ............................ P2003-352593

(51) Int. Cl.
*G06F 13/10* (2006.01)

(52) U.S. Cl. ......................... 711/103; 711/112; 711/162

(58) Field of Classification Search ................. 711/103, 711/161; 714/14
See application file for complete search history.

(56) References Cited

U.S. PATENT DOCUMENTS

| | | | | |
|---|---|---|---|---|
| 4,627,000 | A | * | 12/1986 | Germer ...................... 713/300 |
| 5,701,516 | A | * | 12/1997 | Cheng et al. .................. 710/22 |
| 6,031,755 | A | * | 2/2000 | Ozawa ........................ 365/145 |
| 6,957,158 | B1 | * | 10/2005 | Hancock et al. ............... 702/61 |
| 2001/0022741 | A1 | | 9/2001 | Takeuchi et al. |
| 2004/0174728 | A1 | | 9/2004 | Takano et al. |

FOREIGN PATENT DOCUMENTS

| | | |
|---|---|---|
| JP | 3-48322 | 3/1991 |
| JP | 11-203828 | 7/1999 |
| JP | 2000-284995 | 10/2000 |
| WO | WO 00 74062 | 12/2000 |
| WO | WO 03 009302 | 1/2003 |

OTHER PUBLICATIONS

Seltzer M I et al: "Journaling Versus Soft Updates: Asynchronous Meta-Data Protection in File Systems" Proceedings of the Usenix Annual Technical Conference, XX, XX, Jun. 18, 2000, pp. 71-84, XP009068279.

Edel N K et al: "MRAMFS: a compressing file system for non-volatile RAM" Modeling, Analysis, and Simulation of Computer and Telecommunications Systems, 2004. (MASCOTS 2004). Proceedings. The IEEE Computer Society's 12th Annual International Symposium on Volendam, The Netherlands, EU Oct. 4-8, 2004, Piscataway, NJ, USA,IEE Oct. 4, 2004, pp. 596-603, XP010736881 ISBN: 0-7695-2251-3.

* cited by examiner

*Primary Examiner*—Reginald G Bragdon
*Assistant Examiner*—Kenneth M Lo
(74) *Attorney, Agent, or Firm*—Frommer Lawrence & Haug LLP; William S. Frommer; Thomas F. Presson

(57) ABSTRACT

A file storage apparatus capable of restoring integrity of file management information even when a power supply abnormality occurs without lowering the write speed. When updating meta data stored in an HDD, log data for reconstructing the meta data after update from the meta data before update is written into a non-volatile RAM (NVRAM), then, after this writing is completed, the update is executed. Accordingly, even when the update use meta data temporarily stored in a cache memory is partially lost due to trouble such as a power supply abnormality and when update of the meta data of a hard disk is incomplete, the log data corresponding to the meta data for the update is held in the NVRAM, so it becomes possible to restore the integrity of the meta data on the hard disk by using this log data.

19 Claims, 13 Drawing Sheets

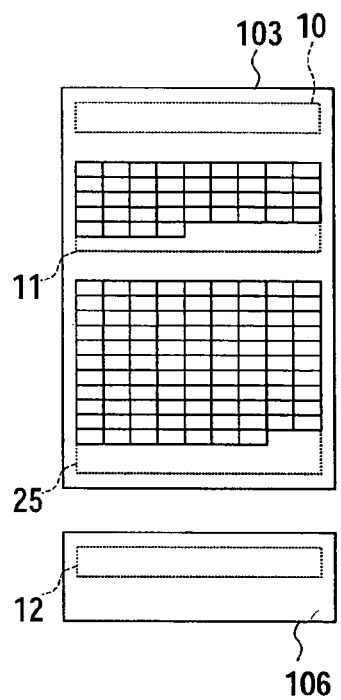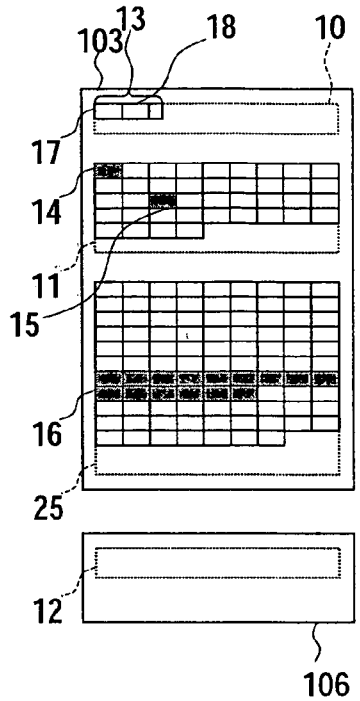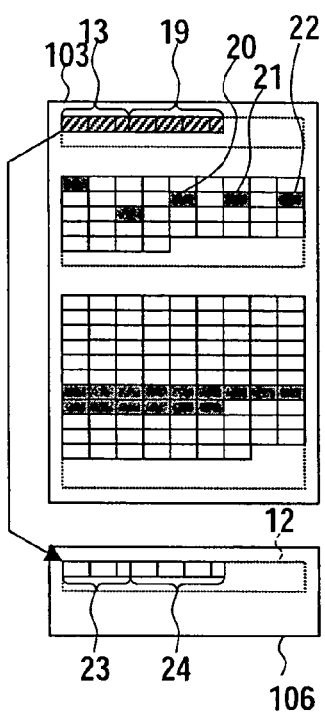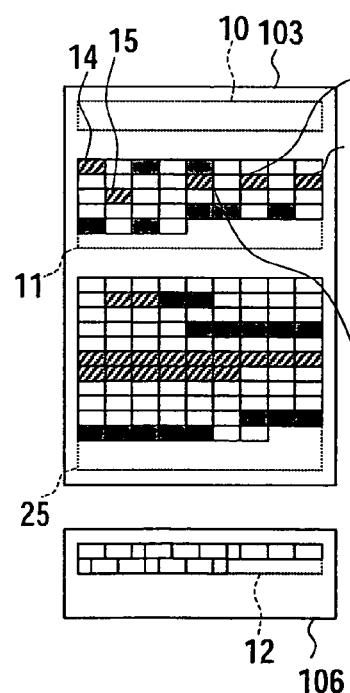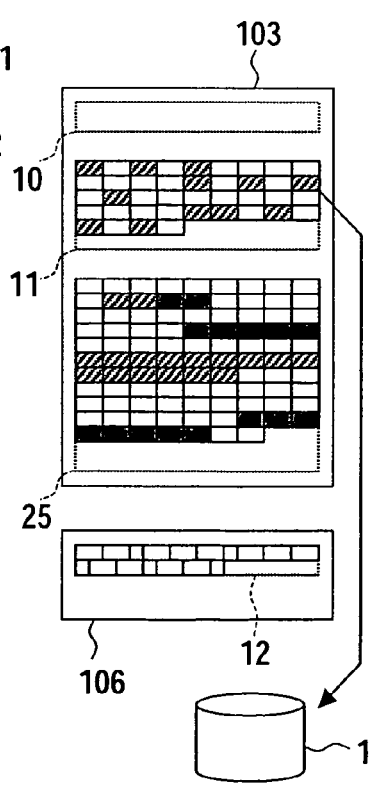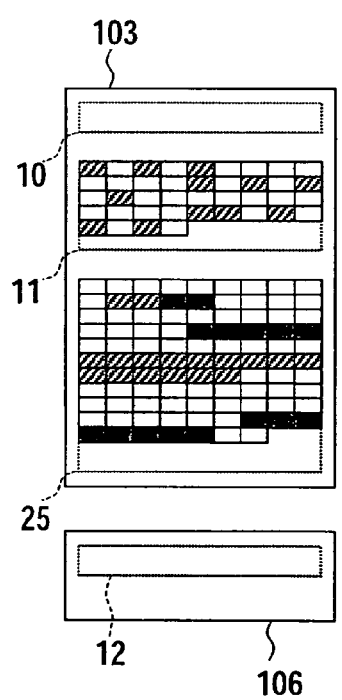

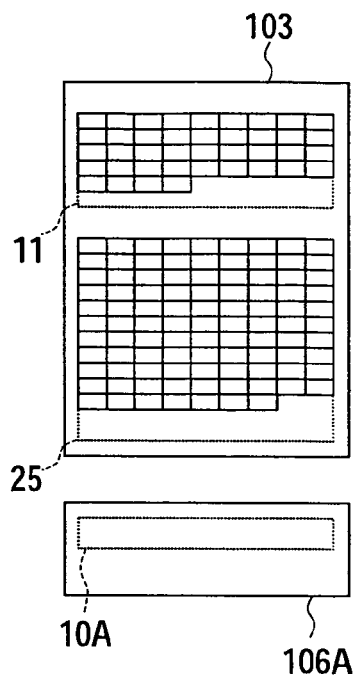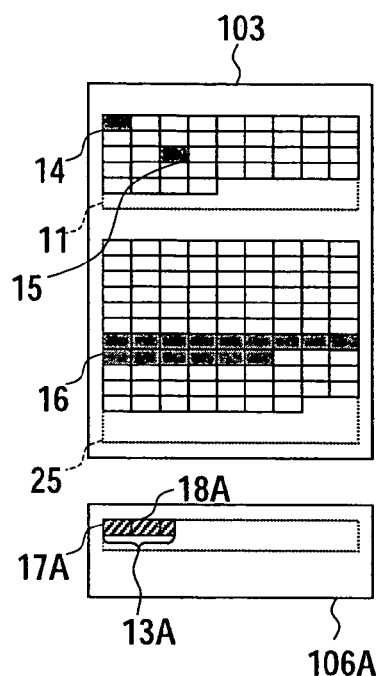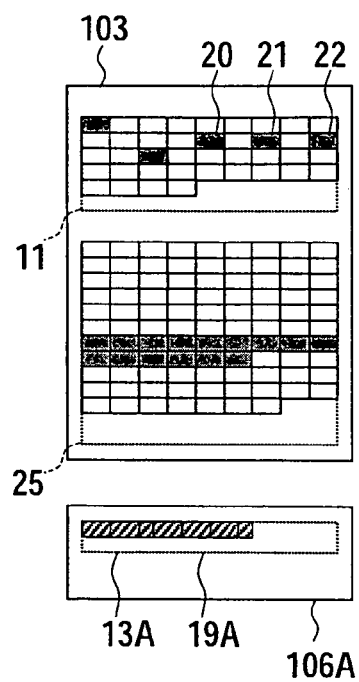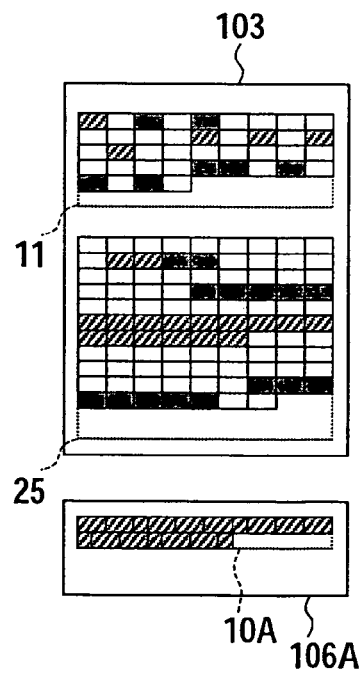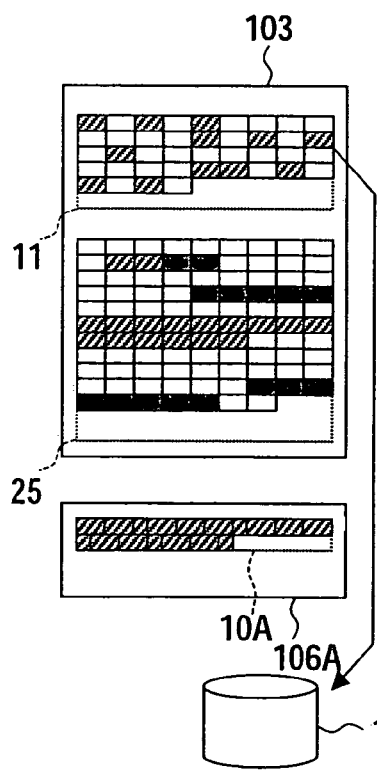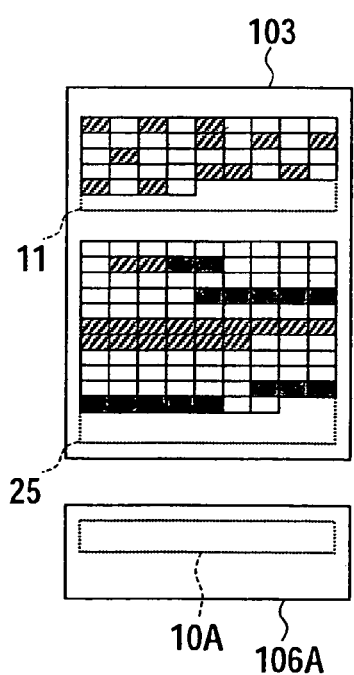

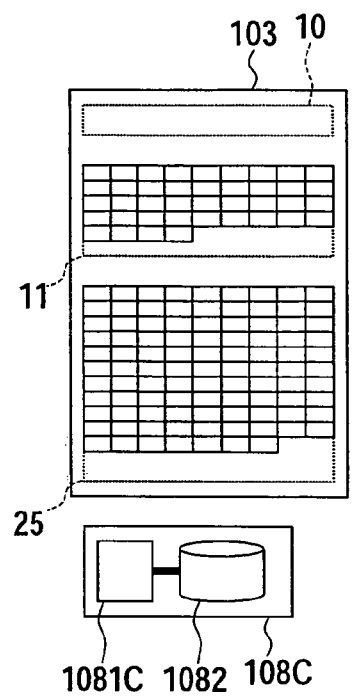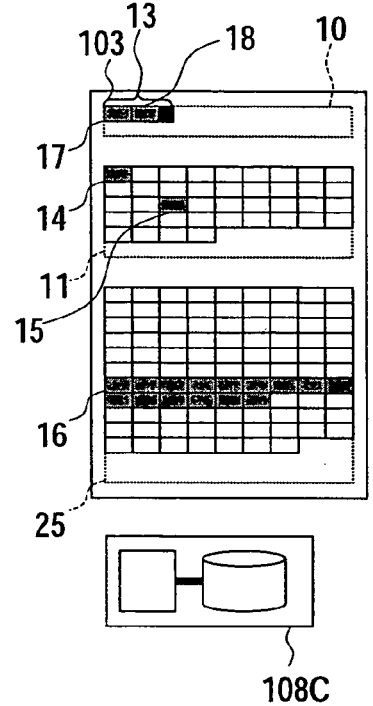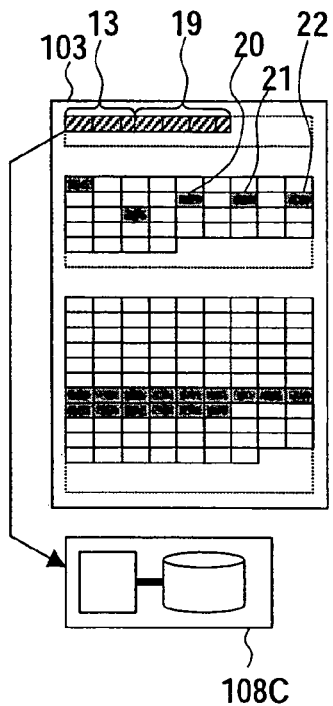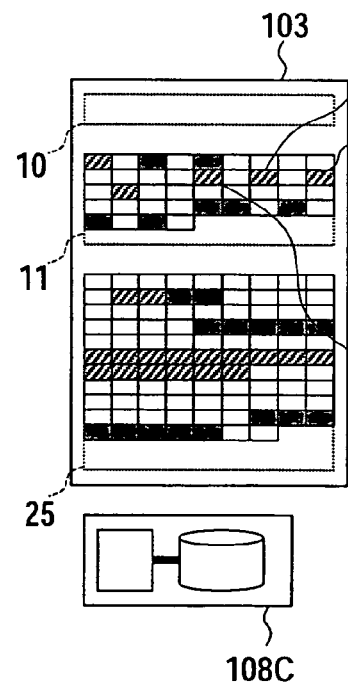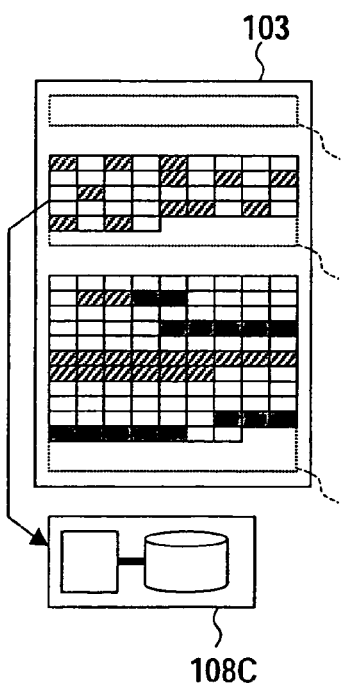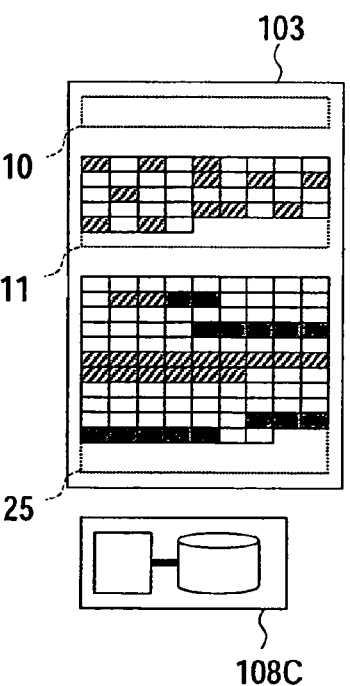

FILE STORAGE APPARATUS FOR STORING FILE DATA AND MANAGEMENT INFORMATION

BACKGROUND OF THE INVENTION

1. Field of the Invention

The present invention relates to a file storage apparatus, more particularly to a file storage apparatus capable of safely protecting a file system from trouble such as sudden power outages (failure) or momentary loss of power.

2. Description of the Related Art

At the present, storage apparatus using disk media such as hard disk drives (hereinafter abbreviated as "HDDs") have been frequently used. There have been remarkable advances in increasing the capacity of these storage media. In recent years, these have not only been used for computer applications, but also for recording video images etc.

When storing a file on such a disk medium, usually use is made of software referred to as a "file system". The files system manages files on the disk medium so that the files can be easily accessed. There are a variety of types of file systems. All of them store management information of the files (hereinafter referred to as "meta data") on the disk medium together with the contents of the files (hereinafter referred to as the "main data").

Meta data includes for example a table indicating the storage position on the disk medium of the main data of each file and information of the capacity etc. For normal operation of the file system, it is indispensable that integrity of the information in the meta data be held. This is because nonintegrity in the meta data causes trouble in access of the entire disk, so even very small damage has a substantial impact.

If the power supply of the apparatus fails when the data is just being written onto a disk medium, sometimes the meta data on the disk medium does not maintain its integrity. The nonintegrity means for example the followings.

Assume that a directory A exists in the file system, and there is a file B in the directory A. The meta data of the directory A has information indicating the having the file B therein and the position and size of the file B on the disk medium. Further, the meta data of the file B has information indicating that the file exists in the directory A.

Here, consider a case where the power supply fails when performing work for deleting the file B from the directory A. It is necessary to update the meta data at least at two positions for deletion of the file. When the work is stopped in the update operation, the meta data of the file B is lost, but the information of the file B in the directory A may remain. In this case, even if the file B looks like it exists from the directory A, it becomes impossible to access its content.

Such nonintegrity sometimes brings the entire system into a critical state. For this reason, in general, in a system mounting a disk medium such as an HDD, the existence of such nonintegrity is checked when starting up the system. When nonintegrity is detected by this check, the system runs a scan check over the entire area of the HDD and tries to recover the integrity of the meta data. This takes enormous time, so the user is unable to use the apparatus for a long time.

A sudden power outage (failure), momentary loss of the power, or other power supply abnormality is a serious problem which may occur in consumer electronics such as video recorders equipped with HDDs not strictly specifying usage procedures of the user, so a variety of corrective measures have been proposed.

For example, Japanese Unexamined Patent Publication (Kokai) No. 2002-32975 discloses duplexing meta data and a technique for managing the same. Here, the meta data, a copy of the meta data, and a descriptor describing their updating history are stored on the disk. The routine is as follows:

(Step ST11)
First, the meta data on a buffer is stored in a first region on the disk.

(Step ST12)
A first value indicating the completion of the storage of the meta data is described in the descriptor.

(Step ST13)
Next, the copied meta data is stored in a second region on the disk.

(Step ST14)
A second value indicating the completion of the storage of the copied meta data is described in the descriptor.

The system performs the processing as follows by referring the value of the descriptor when re-started after the end of an abnormality. For example, when the power supply fails before the storage of the meta data or during the storage, the second value is described in the descriptor. Accordingly, in this case, by overwriting the meta data by the copied meta data, the state where the internal integrity was established before storing the meta data is restored. On the other hand, if the power supply fails during the storage of the copied meta data, the first value is described in the descriptor. In this case, by overwriting the copied meta data by the meta data, the state of normal storage is restored.

However, the larger the capacity of the disk medium, the larger the meta data as well, therefore frequent storage of the duplexed meta data adversely lowers the performance of the system. Further, due to the need in disk management, meta data are arranged dispersed at different positions, so it is necessary to frequently perform a seek operation when rewriting them. For this reason, an enormous time overhead occurs in the rewriting of the meta data.

On the other hand, when the frequency of storage of the meta data is lowered, if there is momentary power loss as explained above, even if the integrity of the meta data can be established by returning to the state before the storage, much information updated after storing the meta data will be lost.

Such problem is overcome to certain extent at present by a technique referred to as "journaling". For example, in a file system such as the XFS of Linux, file management is carried out incorporating this technique.

Next, an explanation will be given of the technique of restoration of meta data by "journaling".

In journaling, at the time of change of the meta data, information concerning the changed part (difference) is stored in a region different from that for the main data (hereinafter referred to as a "log storage region"). The information of the difference (hereinafter referred to as "log data") is used for reconstructing the meta data after update from the meta data before update.

Below, an explanation will be given of the routine for updating meta data in journaling.

(Step ST21)
When performing a file operation accompanied with update of meta data, the information of the meta data to be updated by the file operation is stored as log data in the log storage region on the HDD.

(Step ST22)
After the storage ends, the actual meta data on the HDD is updated.

(Step ST23)
After the change of the meta data ends, the log storage region on the HDD is freed up and writing of the next log data is enabled.

When the power supply of the apparatus fails when performing the work of steps ST21 to ST23, the method of maintaining the integrity of the meta data when the power supply of the apparatus is restored the next time is as follows.

(Case where the Power Supply Fails at Step ST21)

There is a possibility that no correct information will exist in the log storage region on the HDD. However, since no change is made at this point of time at the meta data region on the HDD, the integrity of the meta data is held. In this case, the meta data exhibits the state before the file operation.

(Case where the Power Supply Fails at Step ST22)

There is a possibility that the information in the meta data region on the HDD will not be correct. However, all of the history of change of the meta data remains as log data in the log storage region on the HDD, therefore by writing the meta data reconstructed based on this log data into the meta data region on the HDD, the integrity of the entire meta data can be held. In this case, the meta data enters a state after the file operation.

(Case where the Power Supply Fails at Step ST23)

The information in the log storage region on the HDD is not freed up, so the update information of the meta data existing in the log storage region is written back into the meta data region on the HDD. Namely, the meta data reconstructed based on the log data remaining in the log storage region is written back into the meta data region. In this case, the correct information is already written into the meta data region, but the same information is only written again. This does not degrade the integrity.

It becomes possible to restore the integrity of the meta data no matter when the power supply of the apparatus fails by the above methods. In this case, the log data stored in the log storage region of the HDD is only the amount of the change of the meta data, that is, the difference, and is much smaller in data size than the entire meta data. Further, the log data can be usually stored in continuous locations in the disk together, so the number of seek operations of the head of the HDD can be minimized. Accordingly, the overhead for disk access accompanied with the storage of the log data is relatively small.

Further, so long as this log data is stored, it is possible to reconstruct the meta data based on the log data even if the meta data per se is not stored, and the meta data can be easily restored to a state near the newest meta data. Accordingly, by just frequently storing the log data, the frequency of storage of the meta data itself may be kept to the minimum, so the performance of the disk access is greatly improved.

In the method of duplexing and journaling the meta data explained above, it is assumed that the sequence of writing data to the HDD by the file system and the sequence of writing data to the hard disk are equal.

Most latest HDDS, however, are raised in the write performance to mount a cache memory configured by a volatile memory such as dynamic random access memory (DRAM). The data to be written into the hard disk is stored once in this cache memory, then is changed in write sequence so that the write time becomes the shortest and is written into the hard disk. In the case of a HDD, a wait time for moving the head and the wait time of the disk rotation are very long, therefore by changing the write sequence of the data by the cache memory, deterioration of the performance of the random writing can be reduced to the lowest limit.

In a file system using journaling, if the write sequence is changed in this way, the following disadvantages occur.

When the sequence of steps ST21 and ST22 is inverted, irrespective of the fact that all of the information of the changed meta data is not stored in the log storage region on the HDD, the meta data region on the HDD will be changed.

When the power supply of the apparatus fails at this point of time, even though part of the meta data region on the HDD has been already rewritten, all information for correctly reflecting the content of the change of the meta data on the meta data region will not exist in the log storage region. Accordingly, if the meta data is rewritten based on the information of this log storage region, the integrity of the meta data will be degraded.

When the sequence of steps ST22 and ST23 is inverted, irrespective of the fact that part of the meta data region on the HDD has not yet been correctly changed, the log storage region will be freed up. In this case, the information of the log storage region has already become unusable, so the integrity of the meta data cannot be restored.

Further, even if there is no change of the write sequence, if the power supply fails in the state where part of the log data is stored in the cache memory, the integrity of the meta data cannot be restored.

The state is exactly the same for the method of duplexing the meta data. If the write sequence of two meta files and descriptors ends up being jumbled or if part of the data is missing, the effect of restoration of the meta file ends up being lost.

The method of directly coping with this disadvantage is to forcibly write all of the content of the cache into the hard disk when writing the meta data and the log data into the HDD. In this method, however, the overhead for the disk access becomes extremely large, therefore if the log is frequently updated, this becomes a source of deterioration of the performance of the system.

The disadvantage of the nonintegrity of the meta data due to a power supply abnormality explained above is not limited to a storage device using a disk medium such as an HDD and also exists in a storage device using for example a flash memory. This is because the data transfer speed of a flash memory is slower than an HDD and the power consumption for a rewrite is considerably larger than that of the usual semiconductor memory, so data loss accompanying a momentary power loss in the middle of a rewrite may occur in exactly the same way as the HDD etc.

SUMMARY OF THE INVENTION

An embodiment of the present invention is to provide a file storage apparatus capable of restoring the integrity of file management information even if trouble such as a power supply abnormality occurs, without a lowering of the write speed.

According to the present invention, there is provided a file storage apparatus for storing a file and a management information thereof, including: a first storage means including a volatile memory for temporarily storing data to be stored, and a non-volatile type main storage portion for storing the data to be stored and read out from the volatile memory; a second non-volatile type memory means; and a control means for writing a reconstruction information for reconstructing the management information after being updated from the management information and before providing an update to the second memory means. The control means executes the update of the management information after completion of the write operation.

Preferably, the second storage means performs the data write operation faster than that of the first storage means.

Preferably, the main storage portion includes a disk medium or a flash memory, and the second storage means includes a non-volatile type semiconductor memory.

Preferably, the second storage means includes any one of a ferroelectric random access memory (FeRAM), a magnetic RAM (MRAM), an ovonic unified memory (OUM) and a resistance RAM (RRAM).

The file storage apparatus further includes a power supply voltage monitoring means for monitoring a normal state or an abnormal state of a power supply voltage. The control means divides the reconstruction information, which has an attached predetermined code representing a completion of the write operation to an end thereof, into a plurality of blocks. The control means provides the plurality of blocks to the second storage means in order from the beginning of the block. The second storage means completes the write operation of the block when the power supply voltage monitoring means detects the abnormal state of the power supply during the write operation of the block, and inhibits the write operation of the following block.

Preferably, the second storage means includes a FeRAM.

The file storage apparatus further includes a power supply voltage monitoring means for monitoring a normal state or an abnormal state of a power supply voltage. The control means divides the reconstruction information, which has an attached predetermined code representing a completion of the write operation to an end thereof, into a plurality of blocks, a length of each block being shorter than that of the predetermined code. The control means provides the plurality of blocks to the second storage means in order from the beginning of the block. The second storage means stops the write operation when the power supply voltage monitoring means detects the abnormal state of the power supply during the write operation of the block.

The file storage apparatus also includes a third storage means. The control means assigns storage regions for storing the management information and the reconstruction information, to be stored in the first storage means, to the third storage means. When updating the management information to be stored in the first storage means, the control means writes the resultant updated management information to the storage region of the management information, assigned to the third storage means. The control means also writes the reconstruction information corresponding to the update to the storage region of the reconstruction information, assigned to the third storage means, and copies the reconstruction information written in the storage region of the third storage means to the second storage means. The control means rewrites the resultant update management information written in the third storage means to the first storage means.

The control means assigns storage regions for storing the management information and the reconstruction information, to be stored in the first storage means, to the third storage means. When updating the management information to be stored in the first storage means, the control means writes the resultant updated management information to the storage region of the management information, assigned to the third storage means. The control means writes the reconstruction information corresponding to the update to the storage region of the reconstruction information, assigned to the third storage means, and rewrites the resultant update management information written in the third storage means to the first storage means.

The control means, when the data amount of the reconstruction information storing the second storage means exceeds a predetermined value, writes the management information corresponding to the reconstruction information and after updating the first storage means, requests the open of the volatile memory to the first storage means after the write. The control means provides an open state the storage region of the reconstruction information in the second storage means upon receipt of the open completion notice responsive to the request. The first storage means writes the data remaining in the volatile memory and to be stored to the main storage portion when the open of the volatile memory is requested by the control means. The first storage means informs the completion of the open state to the control means when the write operation is completed.

Preferably, the control means writes the management information for updating the first storage means, after that, requests access to the volatile memory of the first storage means, and accesses the storage region of the reconstruction information for reconstructing the management information for updating, among the storage regions of the second storage means upon receipt of the notice of the completion of the open response to the request from the first storage means. The first storage means writes data remaining in the volatile memory and to be stored to the main storage portion when access to the volatile memory is requested by the control means. The first storage means informs the control means of the completion of the access to the control means when the write operation is complete.

Preferably, the control means requests access to the volatile memory of the first storage means in the shut-down process for terminating the operation, and makes the access to the storage region of the reconstruction information in the second storage means upon receipt of the notice of completion of the access responsive to the request. The first storage means writes the data remaining in the volatile memory and to be stored to the main storage portion when the control means requests access to the volatile memory, and informs the completion of the access to the control means when the write operation is completed.

Preferably, the control means checks whether or not the reconstruction information remains in the second storage means in the start-up process for initiating the operation, and update the management information to be stored to the first storage means on the basis of the remaining reconstruction information.

Preferably, the control means stores at least a part of the information used for the start-up process for initiating the operation, to a part of empty regions of the second storage means which are accessed regions for the reconstruction information.

Preferably, the main storage portion of the first storage means includes a disk medium, the second storage means includes a flash memory, and the control means erases data in a predetermined region including the region for storing the reconstruction information in the flash memory upon receipt of the notice of the open completion responsive to the open request of the volatile memory.

Preferably, the main storage portion includes a disk medium on a flash memory, and the second storage means includes a random-accessible and volatile semiconductor memory supplied with a power supply of a battery.

According to the present invention, there is also provided a file storage apparatus for storing a file and a management information thereof, including: a storage means including a non-volatile memory for temporarily storing data to be stored, and a non-volatile type main storage portion for storing the data read from the non-volatile memory and to be stored; and a control means for writing reconstruction information for reconstructing the management information after updating the previous management information, to the storage means when updating the management information that is stored in the storage means, and executes the update after the write operation.

Preferably, the storage means includes a write control means for changing a sequence of the write to increase the write speed to the main storage portion, when the data to be stored is written from the non-volatile memory to the main storage portion.

Preferably, the storage means includes a write control means for checking the remaining of the data writable to the non-volatile memory in the start-up process for initiating the operation, and writes the remained data to the main storage portion when there is the remained data.

The file storage apparatus further includes a power supply voltage monitoring means for monitoring a normal state or an abnormal state of a power supply voltage. The control means divides the reconstruction information attached a predetermined code representing a completion of the write operation to an end thereof, into a plurality of blocks, and providing the plurality of blocks to the second storage means in order from the beginning of the block, and the second storage means completes the write operation of the block when the power supply voltage monitoring means detects the abnormal state of the power supply during the write operation of the block, and inhibiting the write operation of the following block.

Preferably, the main storage portion includes a disk medium on a flash memory, and the second storage means includes a random-accessible and volatile semiconductor memory supplied with a power supply of a battery.

According to the present invention, the integrity of the file management information can be restored even if trouble such as a power supply abnormality occurs while suppressing a reduction in the write speed.

BRIEF DESCRIPTION OF THE DRAWINGS

These and other objects and features of the present invention will become clearer from the following description of the preferred embodiments with reference to the accompanying drawings, wherein:

FIG. 4 is a diagram illustrating a series of states of update of a file and meta data thereof in the file storage apparatus shown in FIG. 1;

FIG. 9 is a diagram illustrating a series of states of update of a file and meta data thereof in the file storage apparatus shown in FIG. 7;

FIG. 13 is a diagram illustrating a series of states of update of a file and meta data thereof in the file storage apparatus shown in FIG. 11.

DETAILED DESCRIPTION

Figure 1:
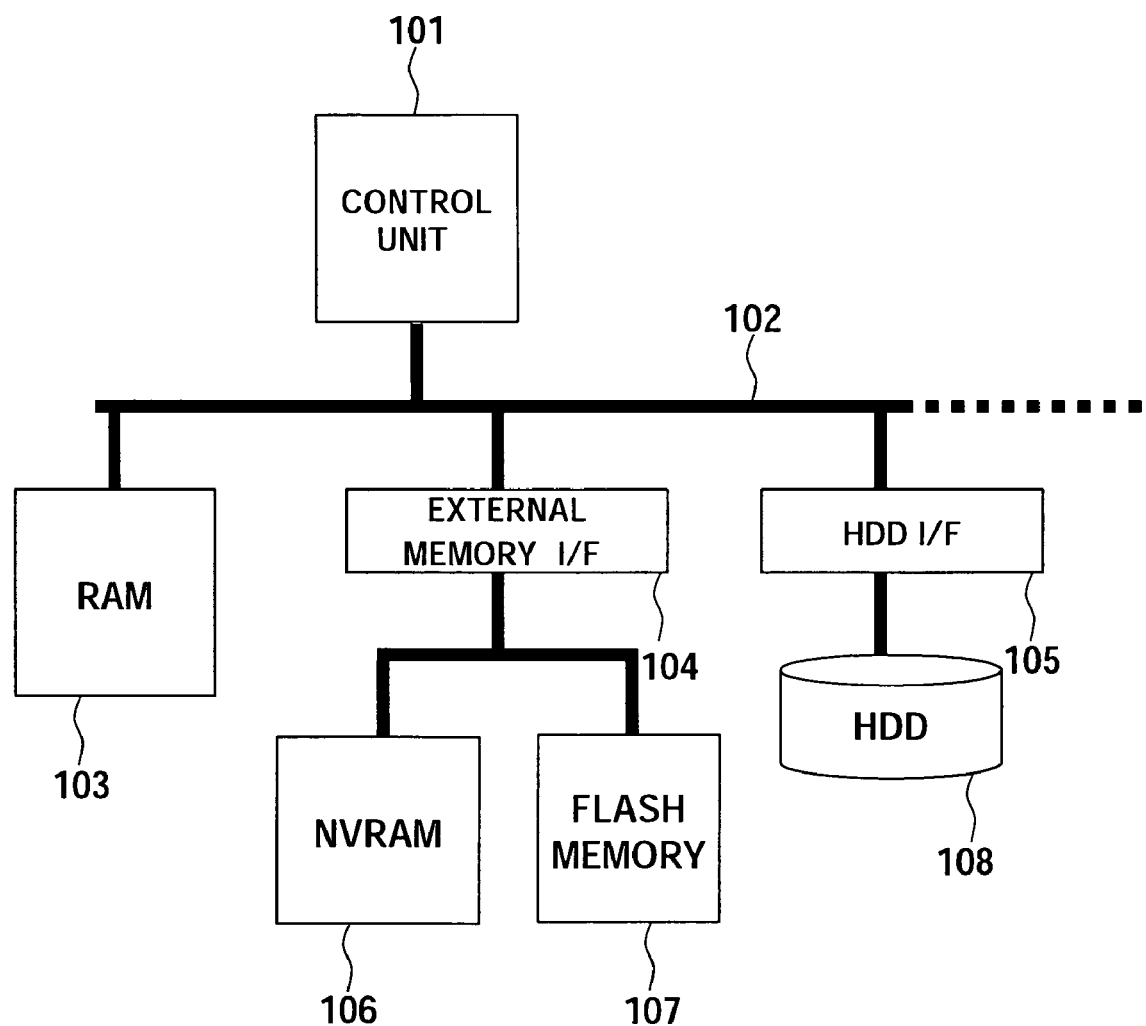
FIG. 1 is a block diagram of an example of the configuration of a file storage apparatus according to one embodiment of the present invention.

Below, an explanation is provided of four embodiments of the present invention by referring to the drawings.

First Embodiment

FIG. 1 is a block diagram of an example of the configuration of a file storage apparatus according to a first embodiment of the present invention.

The file storage apparatus illustrated in FIG. 1 has a control unit 101, a random access memory (RAM) 103, a non-volatile random access memory (NVRAM) 106, a flash memory 107, an HDD 108, an external memory interface unit 104, and an HDD interface unit 105. The control unit 101 is an embodiment of the controlling means of the present invention. The HDD 108 is an embodiment of a first storing means of the present invention. The NVRAM 106 is an embodiment of the second storing means of the present invention. The RAM 103 is an embodiment of the third storing means of the present invention.

The system bus 102 connected to the control unit 101 has a RAM 103 configured by a volatile memory such as a DRAM or SRAM connected thereto. The NVRAM 106 and the flash memory 107 are connected via the external memory interface unit 104. The HDD 108 is connected via the HDD interface unit 105 such as an AT attachment (ATA).

The control unit 101 performs various processing for the overall operation of the file storage apparatus. At the time of startup, the control unit loads an operating system (OS) kernal or program stored in the flash memory 107 on the RAM 103 and executes processing based on this.

The RAM 103 is used as the system memory. Namely, the RAM 103 stores a program of the control unit 101 and temporary data utilized in the processing step thereof. Further, the RAM 103 also provides a work area utilized in the OS or application and a buffer region of files stored in the hard disk 108.

The HDD 108 is the block device for the input and output of data using a data block comprised of a plurality of bytes as a unit and stores various types of data as a file. The file stored in the HDD 108 is configured by a set of for example 512 bytes of file sectors.

When for example recording a TV program on the HDD 108, the control unit 101 first generates a file for an MPEG2 or other file for recording the recording data in the buffer region on the RAM 103. Then, the control unit 101 encodes the video data of the TV program input from a tuner (not shown) to generate the recording data along with the progress of the program and successively adds the same into the above file. The control unit 101 transfers the result of update of the file by this addition from the RAM 103 to the HDD 108 and records from time to time.

Figure 2:
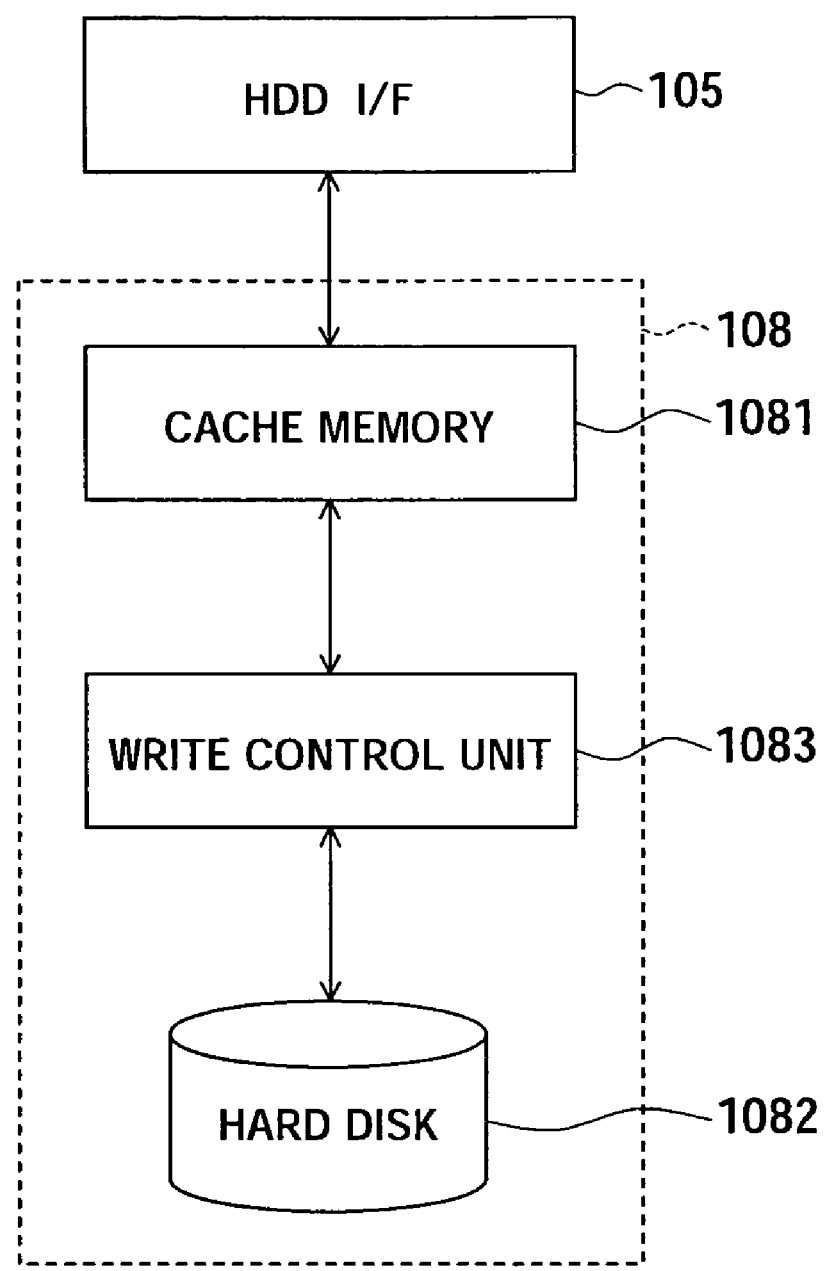
FIG. 2 is a block diagram of an example of the configuration of an HDD in the file storage apparatus shown in FIG. 1.

FIG. 2 is a block diagram of an example of the configuration of the HDD 108. The HDD 108 illustrated in FIG. 2 has a cache memory 1081 of an embodiment of a volatile memory, a write control unit 1083 of an embodiment of the write controlling means, and a hard disk 1082 of an embodiment of the main memory unit. The cache memory 1081 temporarily stores the data to be written. The hard disk 1082 stores the data to be written read out from this cache memory 1081. The cache memory 1081 has a volatile property, and the hard disk 1082 has a nonvolatile property.

Further, the write control unit 1083 controls the writing of data from the cache memory 1081 to the hard disk 1082. For example, the write sequence of the data is suitably changed so as to shorten the write delay due to the wait time of the movement of the head and the wait time of the disk rotation etc. and to speed up the write speed to the hard disk 1082.

The flash memory 107 stores the OS kernal and program as a file. The flash memory 107 is started up faster than the HDD 108 and has no overhead of the read time due to the seek operation either. Therefore, by storing them here, the startup of the system can be made faster.

The flash memory 107 may be a block device too and may be capable of reading the data in byte units too. In the latter case, it is also possible to direct read the OS kernal or program from the flash memory 107 without loading them into the RAM 103. For rewriting the flash memory 107, in general it is necessary to erase the data in units of very large blocks. The speed thereof is slow, therefore preferably the work area etc. which is frequently rewritten is placed in the RAM 103.

The NVRAM 106 is a nonvolatile semiconductor memory having a higher write speed than the HDD 108. When an update operation such as a rewrite or delete is carried out on the file on the HDD 108, this is used for storing the log data for reconstructing the meta data after the update from the meta data before the update.

The NVRAM 106 is realized by for example a ferroelectric random access memory (FeRAM), a magnetic random access memory (MRAM), an ovonic unified memory (OUM), a resistance random access memory (RRAM), etc.

The FeRAM is a semiconductor memory for storing data by the difference of the polarization direction of the ferroelectric film. For example, in the specification of U.S. Pat. No. 4,8736,644, S. Sheffeield et al. propose an example thereof. Further, Japanese Unexamined Patent Publication (Kokai) No. 09-116107 proposes another example.

The MRAM is a semiconductor memory for storing data by the difference of the spin direction of the ferroelectric film. For example, page 128 of the digests of the ISSCC (International Solid-State Circuits Conference) 2000 carries a paper by R. Scheuerlein et al.

The OUM is a semiconductor memory for storing data by the phase transition of a chalcogenide film. For example, page 803 of the digests of the IEDM (International Electron Devices Meeting) 2001 carries a paper by S. Lai et al.

The RRAM is the semiconductor memory for storing data by resistance hysteresis of a magnetoresistance effect material. For example, section 7.5 of the digests of the IEDM 2002 carries a paper by W. W. Zhuang et al.

All of the NVRAMs explained above, as the nonvolatile memories, can autonomously hold the stored state without backup of the power supply. As a RAM, random access in at least units of file sectors is possible.

Further, the memory elements used in these NVRAMs can invert their stored states at 10 .mu.sec or less, i.e., the rewrite speed is high. Namely, when rewriting data, an NVRAM does not take a long time to erase data like a flash memory or perform a mechanical seek like a disk medium. Therefore, when comparing the speeds of rewriting for example 512 bytes of data blocks (sectors) at random, the speed is higher by a few orders in comparison with these devices.

Further, these NVRAMs have excellent features in that the power consumption required for rewriting is much smaller than that of disk media and flash memories and the rewrite durability is higher in comparison with these devices.

Next, an explanation will be given of the file update operation of the file storage apparatus shown in FIG. 1 having the configuration explained above by referring to FIG. 3 and FIG. 4.

Figure 3:
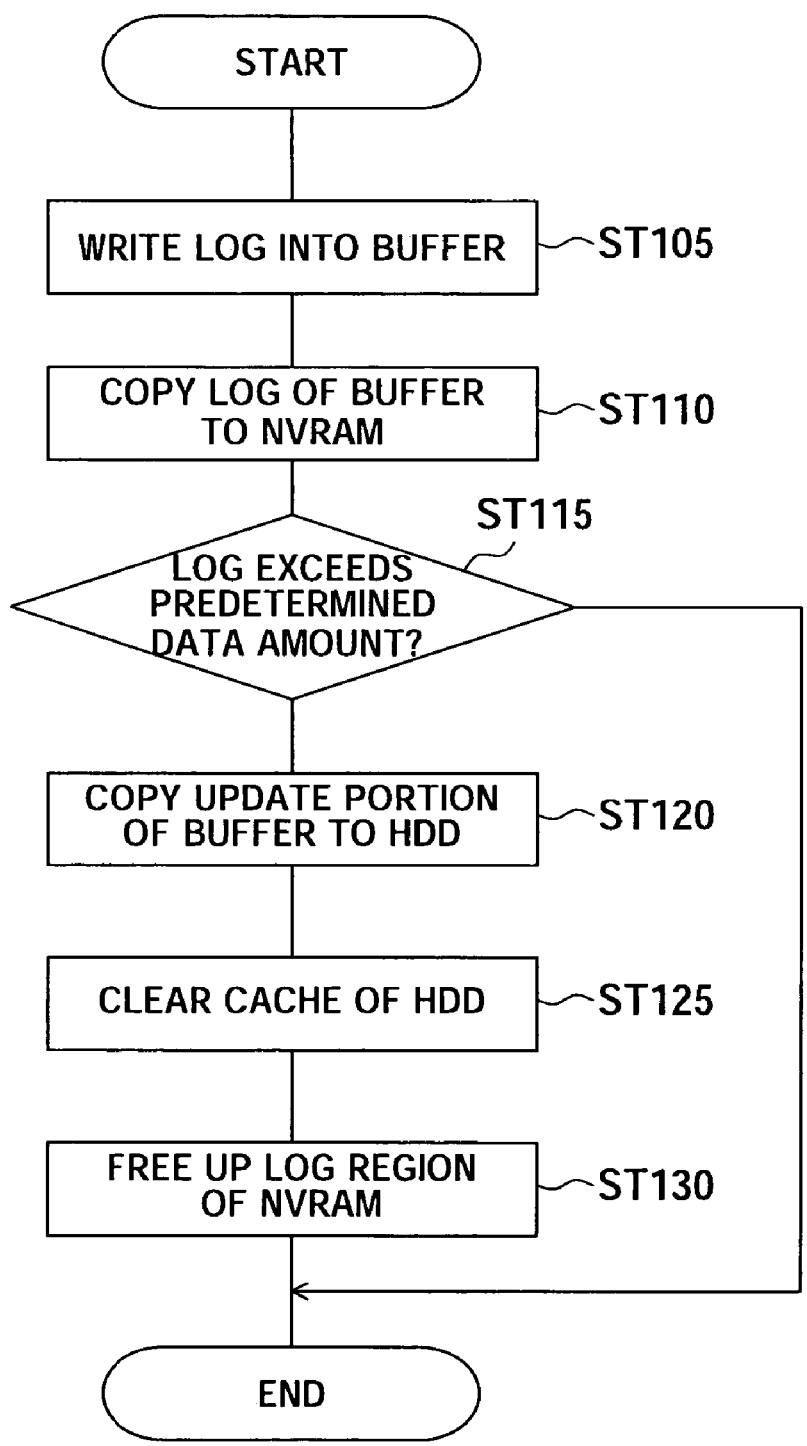
FIG. 3 is a flow chart illustrating an example of the flow of the processing for updating a file on the HDD in the file storage apparatus shown in FIG. 1.

FIG. 3 is a flow chart illustrating an example of the flow of the processing of updating a file on the HDD 108. Further, FIG. 4 is a diagram illustrating a series of states of a file and the meta data thereof in the file storage apparatus shown in FIG. 1. The same notations of FIG. 1 and FIG. 4 indicate the same components.

First, when the control unit 101 accesses the file of the HDD 108, it allocates the memory regions 10, 11, and 25 for buffers of the log data, the meta data, and the file body to the system memory constituted by the RAM 103. The buffer 10 stores the log data, the buffer 11 stores the management information of the file constituted by the meta data, and the buffer 25 stores the file body. Further, at this time, the control unit 101 allocates the memory region 12 of the log data on the NVRAM 106.

Referring to FIG. 4A, when starting the access to the HDD 108, the control unit 101 reads out the data of the HDD 108 to the above buffer if required. Due to this, the meta data is read out to the buffer 11, and the file body is read out to the buffer 25 from the HDD 108. Both of the meta data and file body are comprised of sets of file sectors.

Referring to FIG. 4B, in this state, it is assumed that a rewrite is applied to a certain file of the HDD 108. In this case, the control unit 101 updates the sector group 16 of the file body buffer 25 and updates the meta data 14 and 15 for managing this. Further, the control unit 101 generates log data 13 including copies 17 and 18 of the updated meta data 14 and 15 and writes the same into the log buffer 10 (step ST105). As the data other than the meta data 17 and 18 included in the log data 13, for example, a header indicating the section of log data for every file access and describing the amount of data etc. of each log data, a footer describing an identification code etc. indicating that the update of the log succeeded, an address of each sector on the HDD 108, etc. are included.

Referring to FIG. 4C, assume that a certain file of the HDD 108 is erased. The erasure of a file is usually carried out by only changing the meta data. In this case, the control unit 101 updates the meta data 20, 21, and 22 of the meta data buffer region 11 and adds the log data 19 including copies thereof into the log buffer 10 (step ST105).

Further, here, the control unit 101 transfers the log data 13 and 19 of the log buffer 10 to the log storage region 12 of the NVRAM 106 and writes the same as copies 23 and 24 of the log data (step ST110). The hatching portions in the log data 13 and 19 in the figure indicates that they have been already stored in the NVRAM 106. What is important here is that a collection of log data is always generated for every file access and stored in the NVRAM 106 previous to the corresponding meta data. Due to this, even if trouble such as a power supply abnormality occurs during file access, based on the log data of the NVRAM 106, it becomes possible to recover the integrity of the meta data stored on the hard disk 1082.

It is also possible to copy the log data from the log buffer 10 to the NVRAM 106 whenever file access occurs or copy it where the number of times of file access, the amount of the log data stored in the log buffer 10, the elapsed time from the previous copying, etc. exceed predetermined threshold values. The higher the frequency of copying of the log data to the NVRAM 106, the nearer to the newest data the log data of the hard disk 1082 can be restored to after returning from the end of the abnormality.

Further, an NVRAM is generally expensive, therefore in order to reduce the size (capacity), the log data to be stored in the NVRAM 106 can be suitably compressed as well. When once copying the log data to the NVRAM 106, the log data of the log buffer 10 corresponding to this can be deleted too.

FIG. 4D shows the state after a further file is accessed from the above state. The log data stored in the log buffer 10 is copied to the NVRAM 106 at an appropriate time, and the log data copied from is deleted from the log buffer 10. On the other hand, in the meta data buffer 11, sectors which have been already stored in the HDD 108 and sectors which have not been stored are mixed. They are stored in the HDD 108 at appropriate times so as to keep up with the storage of the corresponding log data, but it is not necessary to store the same in fine units frequently like the log data. For example, sectors 14, 15, 21, 22, and 23 updated in the states of FIG. 4B and FIG. 4C have been already stored, but the sectors updated thereafter are not stored.

Note that there is a built-in cache memory 1081 in the HDD 108 as explained above. Accordingly, for the sectors 14, 15, 20, 21, and 22 as well, it is not clear whether they were actually stored in the hard disk 1082. When the power supply fails in this state without any countermeasures, nonintegrity occurs in the meta data as explained before. In the present embodiment, even if the meta data of the cache memory 1081 is lost, the meta data of the hard disk 1082 can be reconstructed from the already stored log data of the NVRAM 106.

Referring to FIG. 4E, the control unit 101 monitors whether or not the log data stored in the log storage region 12 of the NVRAM 106 exceeds a predetermined amount (step ST115) and, when it exceeds the latter, starts to free up the log storage region 12 of the NVRAM 16 (steps ST120 to 130). For example, where the accumulated log data reaches a certain ratio of the entire capacity of the log storage region 12, the control unit 101 starts to free up the log storage region 12.

First, the control unit 101 confirms that the not yet stored log data is not in the log buffer 10, then writes all of data in the sectors of the meta data buffer 11 which have been updated but have not been stored into the HDD 108 (step ST120). After this writing is completed, the control unit 101 requests the free-up of the cache memory 1081 to the HDD 108. When the HDD 108 receives this free-up request from the control unit 101, it writes the data to be written remaining in the cache memory 1081 into the hard disk 1082 and, when this writing is completed, notifies the completion of the free-up of the cache memory 1081 to the control unit 101 (step ST125).

A considerably long time is taken for freeing up the cache memory 1081, but this may be carried out only at the time of shutting down the system or when the log storage region 12 of the NVRAM 16 approaches a full state. Accordingly, the frequency of this operation is very low. Further, at this time, it is also possible to store the update sectors of the file body buffer 25 in the hard disk 1082 together with the updated meta data.

Referring to FIG. 4F, when receiving the free-up completion notification of the cache memory 1081 from the HDD 108, the control unit 101 frees up the log storage region 12 of the NVRAM 106 (step ST130). Specifically, it invalidates the already existing data of the log storage region 12 and rewrites the header information of the region so that the data can be newly accumulated. Due to this, a new file operation and accumulation of log data become possible.

The entire area of the log storage region 12 was freed up all together in the above example, but it is also possible to sequentially free up parts of the region in accordance with the stored meta data. For example, after transferring the update use meta data 14, 15, 20, 21, and 22 to the HDD 108 (FIG. 4D), the control unit 101 requests the free-up of the cache memory 1081 to the HDD 108 to make the HDD 108 reliably store these already transferred meta data 14, 15, 20, 21, and 22 in the hard disk 1082. Then, when receiving the free-up completion notification from the HDD 108, the control unit 101 frees up the memory region of the log data 23 and 24 for reconstructing the already stored meta data in the log storage region 12.

Next, an explanation will be given of the operation at the time of shutdown and the time of startup of the file storage apparatus shown in FIG. 1 by referring to FIG. 5 and FIG. 6.

Figure 5:
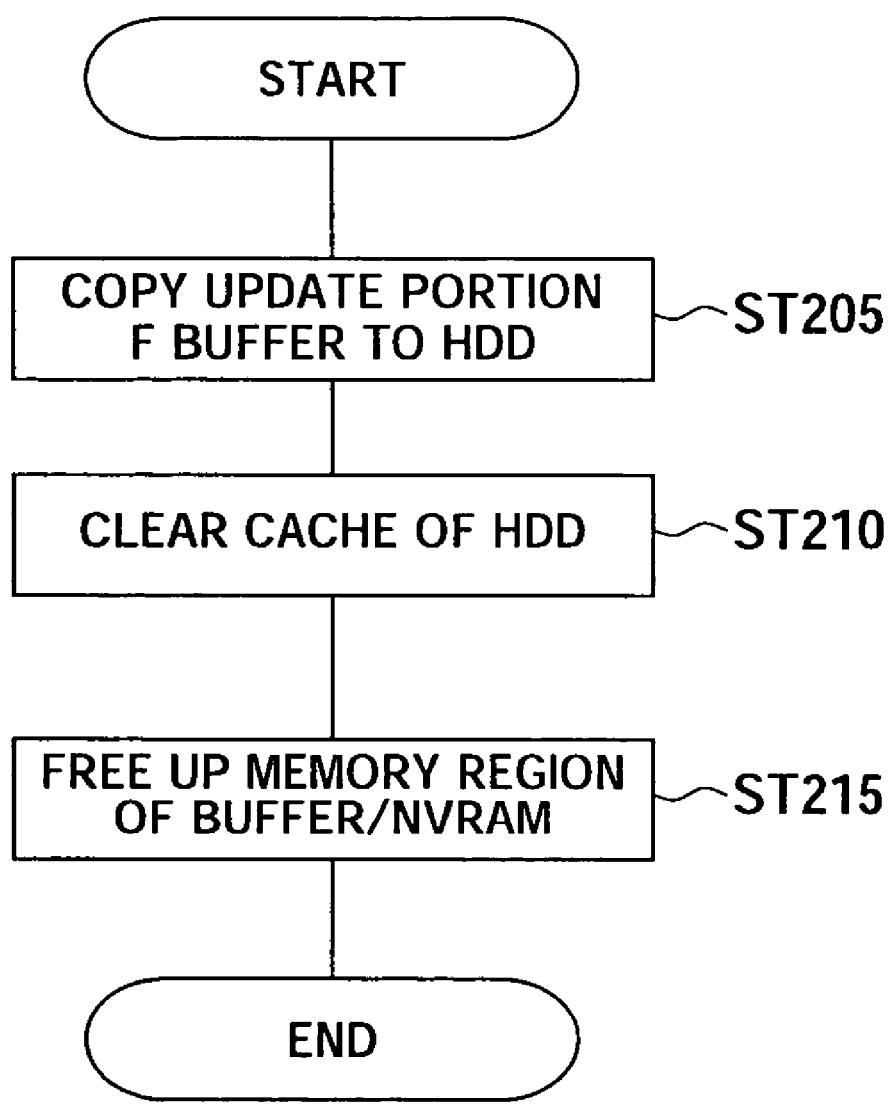
FIG. 5 is a flow chart illustrating an example of the flow of a shutdown process.

FIG. 5 is a flow chart illustrating an example of the flow of the shutdown process.

When shutting down the system normally, the control unit 101 first transfers all of the update meta data stored in the meta data buffer 11 and the file body data stored in the file buffer 25 to the HDD 108 (step ST205). Then, it requests the free-up of the cache memory 1081 to the HDD 108 to make the HDD 108 store all of the data remaining in this in the hard disk 1082 (step ST210). When receiving the free-up completion notification of the cache memory 1081 from the HDD 108, the control unit 101 frees up the log storage region 12 of the buffers 10, 11, and 25 of the RAM 103 and the NVRAM 106 (step ST215).

Figure 6:
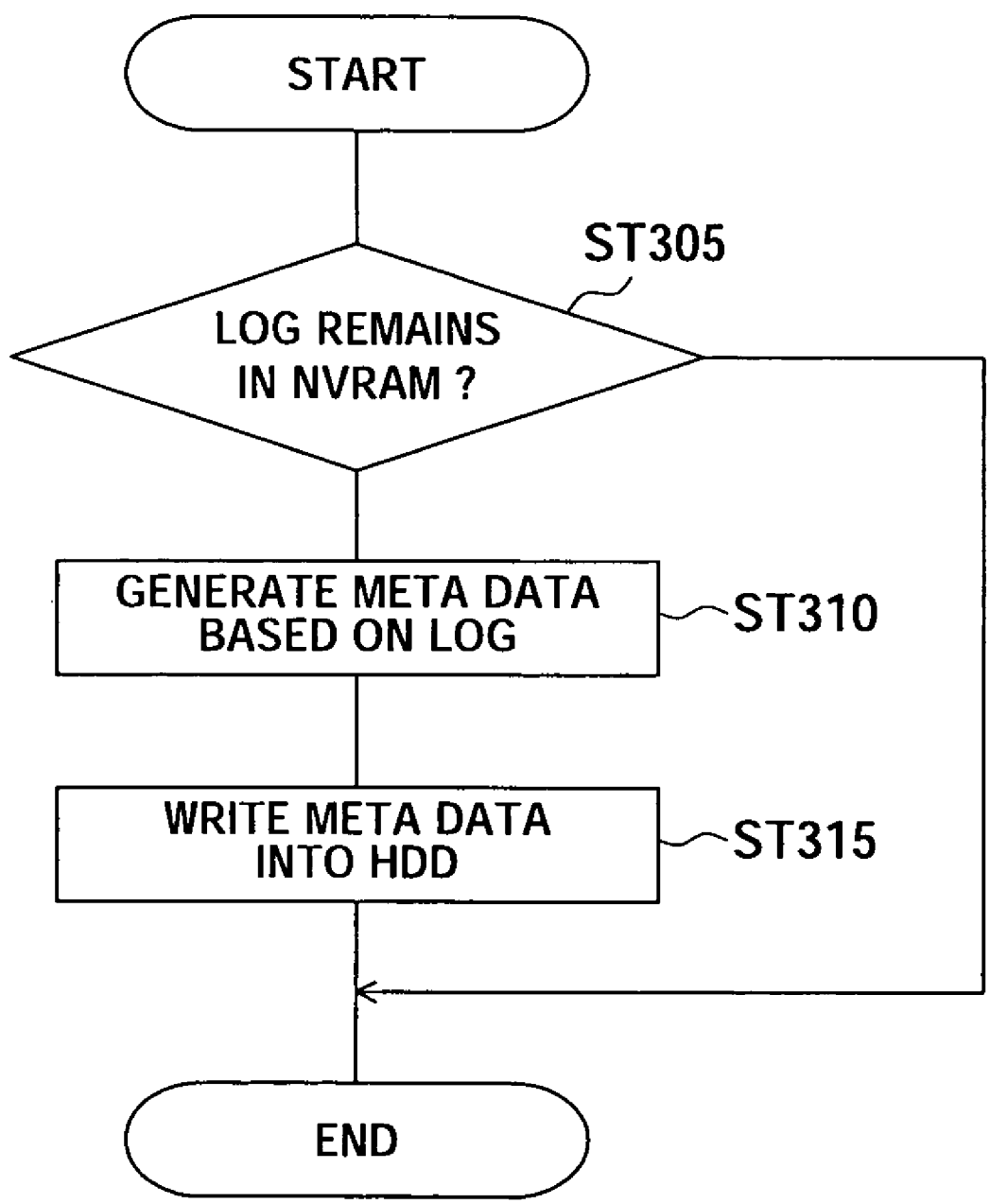
FIG. 6 is a flow chart illustrating an example of the flow of a startup process.

FIG. 6 is a flow chart illustrating an example of the flow of the startup process.

At the time of the system startup, the control unit 101 first checks whether or not any log data remains in the log storage region on the NVRAM 106 (step ST305). If there is no remaining log data, it performs the startup as usual. On the other hand, when log data remains in the NVRAM 106, the control unit 101 judges that the abnormality ends and generates the meta data based on this log data (step ST310). Then, it writes the generated meta data into the HDD 108 (step ST315).

As explained above, according to the file storage apparatus according to the present embodiment, when updating the meta data stored in the HDD 108, first, the log data for reconstructing the meta data after update from the meta data before update is written into the NVRAM 106. Then, after the completion of this writing, the update is executed. Accordingly, even in a case where the meta data for update temporarily stored in the cache memory 1081 is partially lost due to trouble such as a power supply abnormality and a case where the update of the meta data of the hard disk 1082 is incomplete, the meta data corresponding to the meta data for update is incomplete and the log data corresponding to the meta data for the update is stored in the NVRAM 106, so it becomes possible to restore the integrity of the meta data on the hard disk 1082 by using this log data.

Further, an NVRAM of a higher speed than the HDD is used for storing the log data, therefore, it becomes possible to increase the writing frequency of the log data into the HDD 108 while suppressing a drop in the write speed.

For example, assume that trouble such as a momentary power loss occurs in the state of FIG. 4B. In this case, all of the data of the buffer on the RAM 103 is lost, and the log data is not stored in the NVRAM 106. Therefore, as a result, the meta data becomes the same state as that of FIG. 4A before the file operation. In this case, no nonintegrity of the meta data occurs, but the user loses the results of work of one file operation. On the other hand, when trouble occurs in the state of FIG. 4C, the log data has been already stored in the NVRAM 106, so the meta data can be returned to the newest state. In this way, the frequency of storage of the log data is an important element for restoring the file to a state nearer the newest data when trouble occurs. Accordingly, if using a high speed NVRAM for storing log data as in the present embodiment, even if the log is stored with a high frequency, the access speed of the file is not lowered. Namely, it is possible to achieve both durability of the system and performance.

Further, generally, a high speed storage medium is more expensive than a low speed storage medium, but as explained above, the storage data for a log is much smaller than the meta data per se and can be discarded when the meta data is stored. Accordingly, even in an HDD for storing 100 gigabytes, the size of the memory region for the log data need only be about for example 1 to 10 megabytes. Namely, by using the NVRAM 106 for storing the log data, there is no accompanying large increase in cost and even at the time of trouble such as a momentary power loss, the file system can be reliably protected and the access speed of a file can be raised.

Further, according to the file storage apparatus according to the present embodiment, free-up of the cache memory 1081 is requested to the HDD 108 in the process of the shutdown processing, and the data to be written remaining in the cache memory 1081 is written into the hard disk 1082 in response to this request. Upon completion of this writing, the log storage region 12 of the NVRAM 106 is freed up. Due to this, when the shutdown processing is normally executed, the log storage region 12 of the NVRAM 106 is freed up. Therefore, by checking whether or not any log data remains in the NVRAM 106 at the time of startup, it becomes possible to decide whether or not the shutdown processing was normally carried out. Further, after the meta data remaining in the volatile cache memory 1081 is reliably written into the nonvolatile hard disk 1082, the log storage region 12 of the NVRAM 106 is freed up, so no nonintegrity will be caused in the meta data stored in the hard disk 1082.

Further, in the startup process, when log data remains in the log storage region 12 of the NVRAM 106, the meta data stored in the HDD 108 is updated based on this remaining log data. Due to this, when the shutdown processing was not normally executed, at the time of startup, the integrity of the meta data is restored based on the log data remaining in the log storage region 12.

Note that the log storage region 12 of the NVRAM 106 is freed up at the time of the shutdown processing as explained above, so this empty memory region can be effectively utilized too. Namely, it is also possible to store at least part of the information which becomes necessary in the startup processing in at least part of the empty region of the NVRAM 106 after the log storage region 12 is freed up by the shutdown processing. The information required for the startup processing is for example part of the OS kernal, part of the file read from the HDD 108 etc. at the time of startup, and further part of the work area constructed on the system memory 103 at the time of startup. By storing this information in the high speed NVRAM 106, it is possible to achieve an increase in speed of the startup processing. The information stored in the NVRAM 106 is fetched into the RAM 103 after the startup processing ends, so can be deleted. Accordingly, the memory region used for the storage of the information can be utilized for storing the log data.

Second Embodiment

Figure 7:
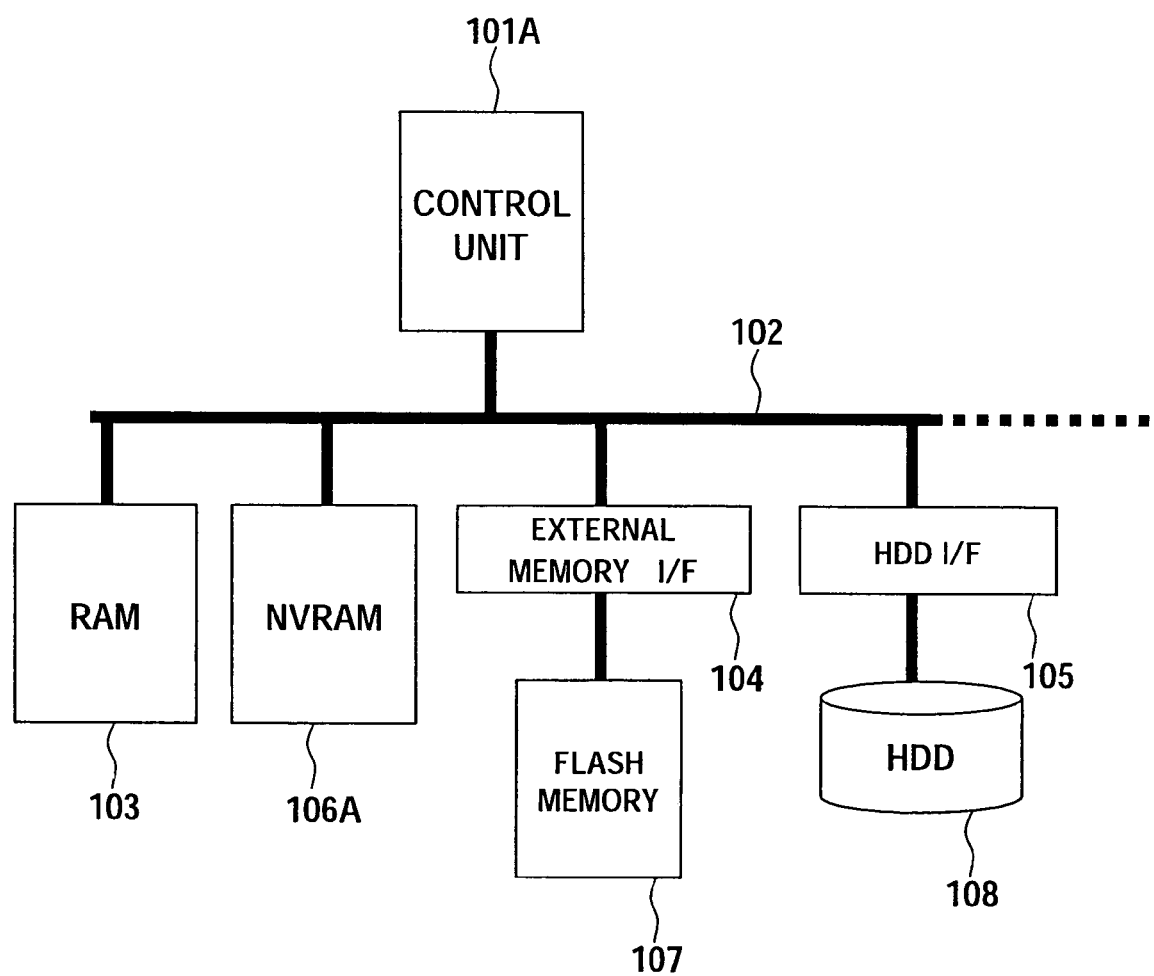
FIG. 7 is a block diagram of an example of the configuration of a file storage apparatus according to another embodiment of the present invention.

Next, a second embodiment of the present invention will be explained. FIG. 7 is a block diagram of an example of the configuration of a file storage apparatus according to the second embodiment of the present invention.

The file storage apparatus illustrated in FIG. 7 has a control unit 101A, a RAM 103, an NVRAM 106A, a flash memory 107, an HDD 108, an external memory interface unit 104, and an HDD interface unit 105. Note that the same notations of FIG. 1 and FIG. 7 show the same components.

The difference of the file storage apparatus shown in FIG. 1 and FIG. 7 resides in the method of connecting the NVRAM used for storing the log data and the system bus 102. Namely, in the former apparatus, the NVRAM 106 is connected to the system bus 102 via the external memory interface unit 104 and used as an external storage, but in contrast, in the latter device, the NVRAM 106A is provided in part of the system memory the same as the RAM 3.

Accordingly, in the file storage apparatus shown in FIG. 7, it is possible to directly use the NVRAM 106A as the log buffer. When using the NVRAM 106A as the system memory, random access in units of bytes and an access performance equivalent to the RAM 103 is required, but it is not necessary to separately back up the log data, and thus redundancy of the log data is not required. Therefore, an increase in speed and reduction of cost in comparison with the file storage apparatus shown in FIG. 1 can be achieved.

Next, an explanation will be given of the file update operation of the file storage apparatus shown in FIG. 7 having the above configuration by referring to FIG. 8 and FIG. 9.

Figure 8:
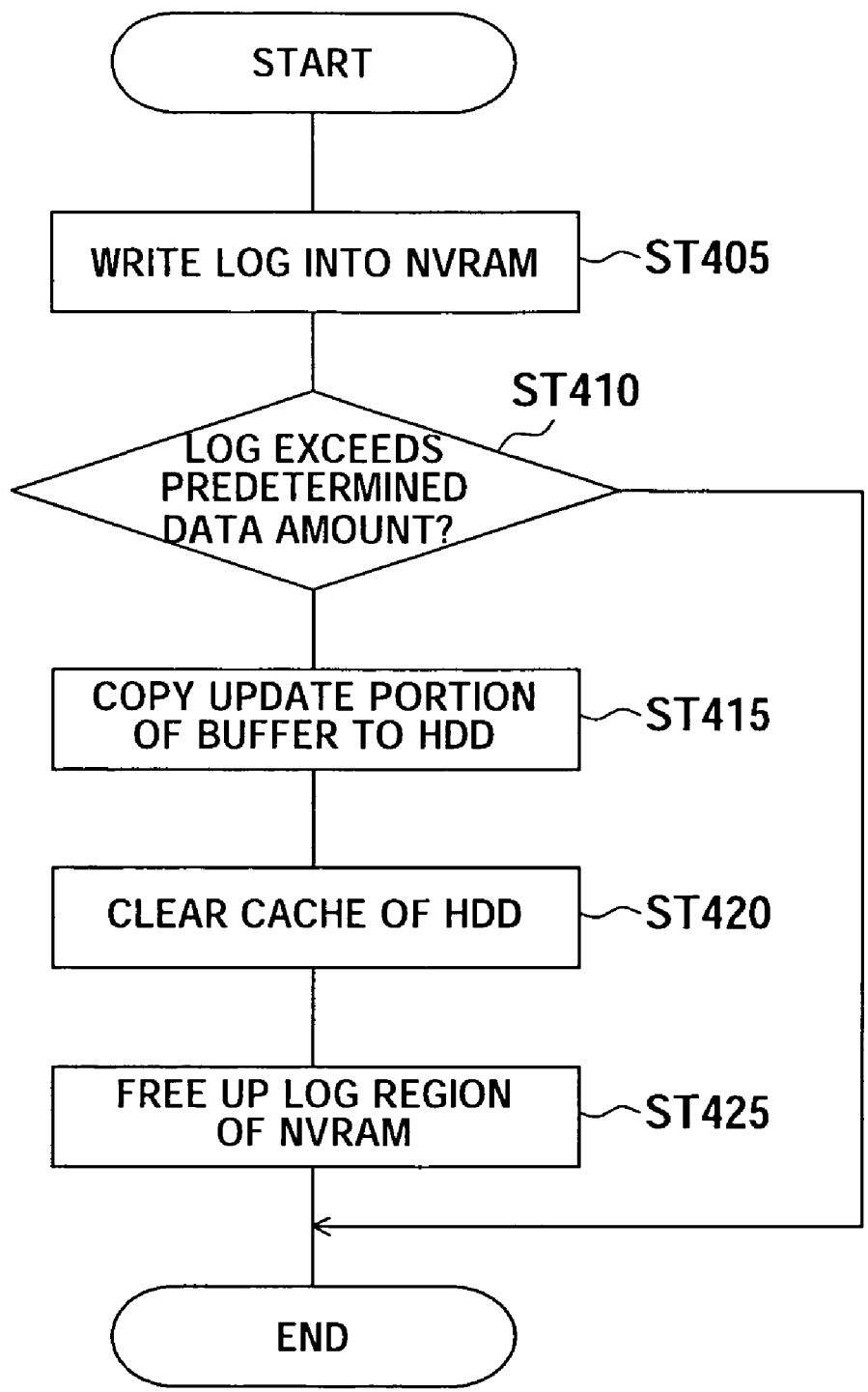
FIG. 8 is a flow chart illustrating an example of the flow of the processing of updating a file on the HDD in the file storage apparatus shown in FIG. 7.

FIG. 8 is a flow chart illustrating an example of the flow of the processing for updating a file on the HDD 108 in the file storage apparatus shown in FIG. 7. Further, FIG. 9 is a diagram illustrating a series of states of update of a file and the meta data thereof in the file storage apparatus shown in FIG. 7. The same notations of FIG. 7 and FIG. 9 show the same components.

First, when the control unit 101A accesses the file of the HDD 108, it allocates the buffer memory regions 11 and 25 of the meta data and the file body to the system memory constituted by the RAM 103. Further, it directly allocates the-log data buffer 10A onto the NVRAM 106A configuring part of the system memory.

Referring to FIG. 9A, when starting the access to the HDD 108, the control unit 101A reads out the data of the HDD 108 to the above buffer if required. Both of the meta data and file body are comprised of sets of file sectors.

Referring to FIG. 9B, assume that a certain file of the HDD 108 is rewritten in this state. In this case, the control unit 101A updates the sector group 16 of the file body buffer 25 and also updates the meta data 14 and 15 for managing the same. Further, the control unit 101A generates log data 13A including copies 17A and 18A of the updated meta data 14 and 15 and writes this into the log buffer 10A of the NVRAM 106A (step ST405). The NVRAM 106A is nonvolatile, so the data stored here is maintained even if the power supply is cut. Note that in order to reduce the space occupied in the expensive NVRAM, the log data can be stored on the NVRAM 106A after being compressed as well.

Referring to FIG. 9C, further, assume that a certain file of the HDD 108 is erased. The erasure of the file is usually carried out by only a change of the meta data. In this case, the control unit 101A updates the meta data 20, 21, and 22 of the meta data buffer region 11 and adds the log data 19A including a copy thereof to the log buffer 10A (step ST405).

FIG. 9D shows a state where a further file is accessed from the above state. In the log buffer 10A of the NVRAM 106A, the log data generated for every file access is sequentially accumulated. On the other hand, in the meta data buffer 11, sectors which have been already stored in the HDD 108 and unstored sectors are mixed.

Regarding FIG. 9E, the control unit 101A monitors whether or not the log data stored in the log buffer 10A of the NVRAM 106 exceeds a predetermined amount (step ST410). When it exceeds this, it starts to free up the log buffer 10A of the NVRAM 106A (steps ST415 to 425). For example, when the accumulated log data reaches a certain ratio of the entire capacity of the log buffer 10A, it starts to free up the log buffer 10A.

First, the control unit 101A writes all of the sectors among the sectors of the meta data buffer 11 which were updated and have not been stored into the HDD 108 (step ST415). After this writing is completed, the control unit 101A requests the free-up of the cache memory 1081 of the HDD 108. When the HDD 108 receives this free-up request from the control unit 101A, it writes the data to be written remaining in the cache memory 1081 into the hard disk 1082. When this writing is completed, it notifies the completion of the free-up of the cache memory 1081 to the control unit 101A (step ST420).

Regarding FIG. 9F, when receiving the free-up completion notification of the cache memory 1081 from the HDD 108, the control unit 101A frees up the log buffer 10A of the NVRAM 106A (step ST425). Specifically, it invalidates the already existing data of the log buffer 10A and rewrites the header information of the region so that the data can be newly accumulated. Due to this, a new file operation and accumulation of log data become possible.

Note that, in the above example, the entire area of the log buffer 10A was freed up all together, but it is possible to sequentially free up part of the area in accordance with the stored meta data. For example, the control unit 101A transfers the updated meta data to the HDD 108 by one or more file accesses in order from the oldest data, then requests the free-up of the cache memory 1081 to the HDD 108 and makes the hard disk 1082 reliably store this already transferred meta data. Then, when receiving the free-up completion notification from the HDD 108, it frees up the memory region of the log data corresponding to this storage finished meta data in the log buffer 10A.

As explained above, in the file storage apparatus according to the present embodiment as well, in the same way as the file storage apparatus shown in FIG. 1, the file system can be reliably protected also at the time of trouble such as a momentary power loss while suppressing a drop of the access speed of a file. Further, along with each file access, the log data is directly stored in the NVRAM, so the newest update information of the file is always secured. In addition, it is not necessary to separately perform the processing of storing the data in the NVRAM from the log buffer as in the file storage apparatus shown in FIG. 1, so it is possible to raise the efficiency of the processing and increase the speed.

Third Embodiment

Next, a third embodiment of the present invention will be explained.

In the above embodiments, it is important to store the log data by dividing the data into groups in units of file access. This is because when a plurality of sectors of the meta data are updated by one file access, if there are updated sectors and non-updated sectors among them, nonintegrity occurs between meta data.

The validity of such log data can be judged by describing the identification code indicating that the writing thereof was completed at the end of for example each log data and checking the value thereof. However, if a momentary power loss occurs while writing the log data per se and uncertainty occurs in the written data due to that, there is a possibility of erroneous judgment.

This can frequently occur particularly when writing in units of huge block data in a flash memory, disk medium, etc. Namely, these devices try to simultaneously store an identification code indicating storage completion of the log data and the update content per se all together, therefore if a momentary power loss occurs at the time of this storage, there is a possibility that only the identification code will be correctly stored, but part of the update content will not be stored. In this case, an erroneous judgment is made regarding that log data which was not correctly written was correctly written, so nonintegrity of the meta data occurs. In the case of an NVRAM, the write speed is very fast in comparison with these devices, therefore the probability of occurrence of such uncertainty is low, but cannot be said to be zero.

The first method for overcoming such a disadvantage is to prevent the occurrence of uncertainty at the time of writing the log data. The prevention of uncertainty means that when the power supply fails during writing, either all of the blocks of the data becoming units of writing of the medium (hereinafter referred to as blocks) are reliably stored in the medium or no blocks at all are stored. More preferably, when the power supply fails during the writing, all of the data in the middle of being writing is reliably stored, then access after that is prohibited.

Figure 10:
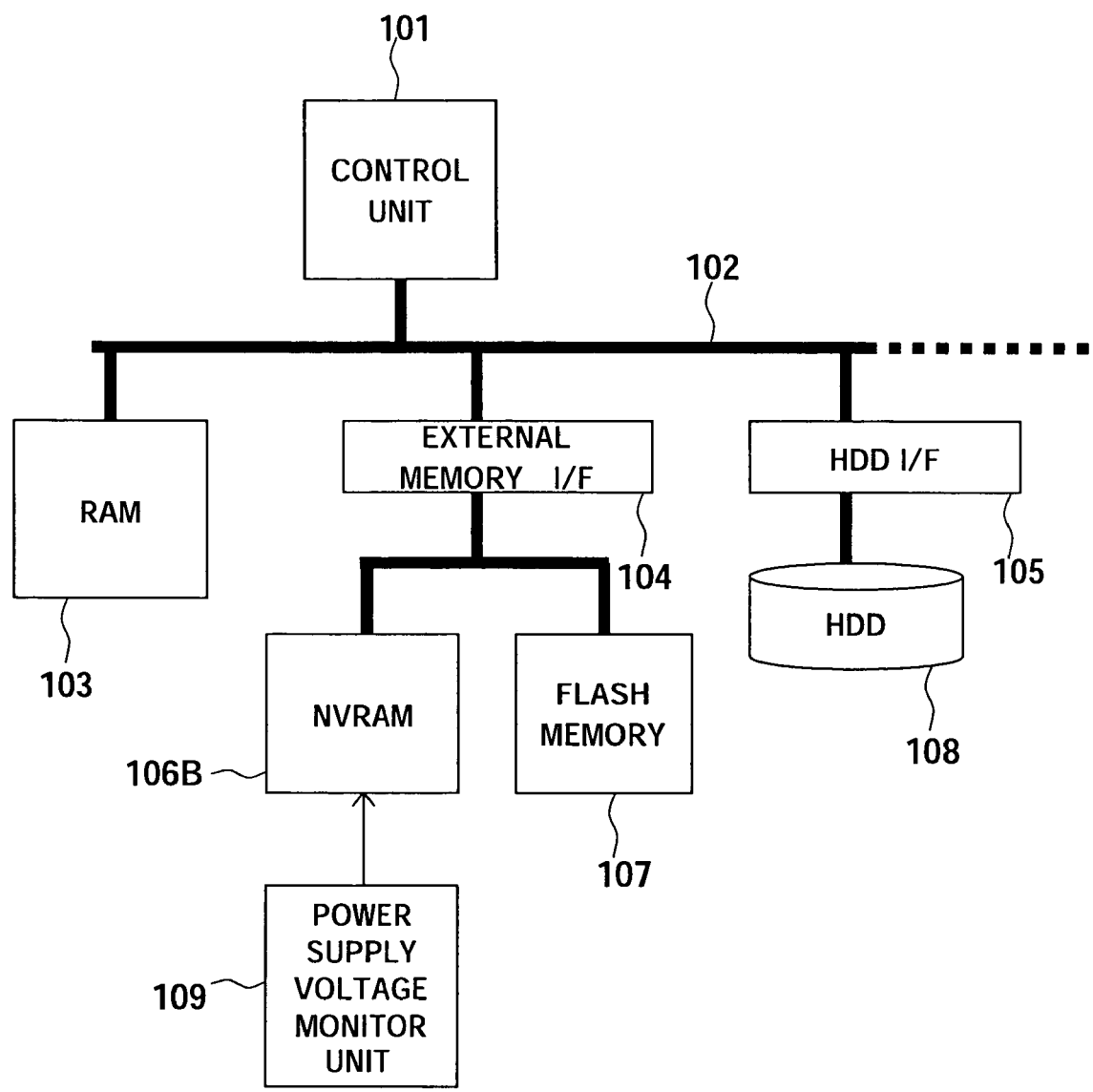
FIG. 10 is a block diagram of an example of the configuration of a file storage apparatus according to yet another embodiment provided with a means for preventing occurrence of uncertainty in the file storage apparatus shown in FIG. 1.

FIG. 10 is a block diagram of an example of the configuration of a file storage apparatus according to the present embodiment providing a means for preventing occurrence of uncertainty in the file storage apparatus shown in FIG. 1. The file storage apparatus illustrated in FIG. 10 replaces the NVRAM 106 in the file storage apparatus shown in FIG. 1 by an NVRAM 106B and provides a power supply voltage monitor unit 109 for monitoring for any abnormality of the power supply voltage.

The power supply voltage monitor unit 109 outputs a signal reporting an abnormality when for example, as an abnormality of the power supply voltage, the power supply voltage becomes lower than a predetermined voltage.

The NVRAM 106B is sequentially supplied with the above log data generated in the control unit 101 divided for every predetermined block (for example file sector) from the head block. Further, the tail end of the log data generated for every file access in the control unit 101 has a predetermined identification code indicating the completion of the writing attached to it. The NVRAM 106B sequentially inputs such blocks and writes them into the memory region, but when the power supply voltage monitor unit 109 detects an abnormality during the write operation of a block, completes the writing of the block in the middle of being written and then prohibits the writing of blocks after this.

An NVRAM generally has a high write speed and a small power consumption as well, therefore so long as a momentary power loss can be detected, it is possible to complete a write operation performed up to the middle by using the very little charge remaining in the parasitic capacitor etc. of the substrate and completely prohibit next accesses.

Note that some NVRAMs read and destroy data like FeRAMs. In this case, even if the power supply fails in the middle of a read operation, it is necessary to protect the data being read so as not to be lost. Specifically, when a momentary power loss is detected in the middle of a read operation, the data is reliably read out to the sense amplifier by using the charge remaining in the parasitic capacitor etc. of the substrate, the processing up to the next write operation to a memory cell to be read out is completed, and the access thereafter is prohibited.

The write operation of an FeRAM is carried out just by applying voltage to the cell capacitor, therefore the write power consumption is the smallest among all NVRAMs. Accordingly, mounting of a protective function at the time of writing and the time of reading is the easiest. This is a memory particularly suited to the applications of the present embodiment.

The above first method is for directly preventing uncertainty of the log data. It is possible to prevent nonintegrity of the meta data so long as erroneous judgment of the log data as being the normally written data can be prevented even if part of a block of the log data becomes uncertain.

Therefore, as a second method, it is also possible to make the data length of the block when writing log data into a storing means such as an NVRAM shorter than the data length of the identification code explained above attached to the tail end of the log data. So long the NVRAM can handle byte accesses, the log is stored in units of for example 16 bits, and the length of the identification code is made 32 bits.

When using as an example the file storage apparatus shown in FIG. 10, the control unit 101 according to the second method divides the log data having a predetermined identification code indicating completion of writing attached to the tail end into a plurality of blocks each having a shorter data length than that of the identification code and sequentially supplies that log data to the NVRAM 106B from the head of the blocks. The NVRAM 6B according to the second method suspends the write operation of the blocks when the power supply voltage monitor unit 109 detects an abnormality during the write operation of the supplied blocks. In this case, there is a possibility that an abnormality of the power supply voltage will occur while the log data is being written into the NVRAM 106B and that part of block of this log data will become uncertain in written state. However since the identification code has a longer data length than any block, in this case the identification code is not written into the NVRAM 106B at all or only partially written. Due to this, if judging whether writing of the log data has been completed based on the identification code, it will be judged that the writing of the log data was incomplete with a high probability, so there will be less worry over handling log data failed to be fully written as log data finished being written.

Fourth Embodiment

Next, a fourth embodiment of the present invention will be explained.

In the above first and second embodiments, the meta data was reconstructed based on the log data stored in a nonvolatile storing means such as an NVRAM, but in the present embodiment, the meta data is reconstructed based on the log data stored in a storing means having a nonvolatile cache memory and main memory unit.

Figure 11:
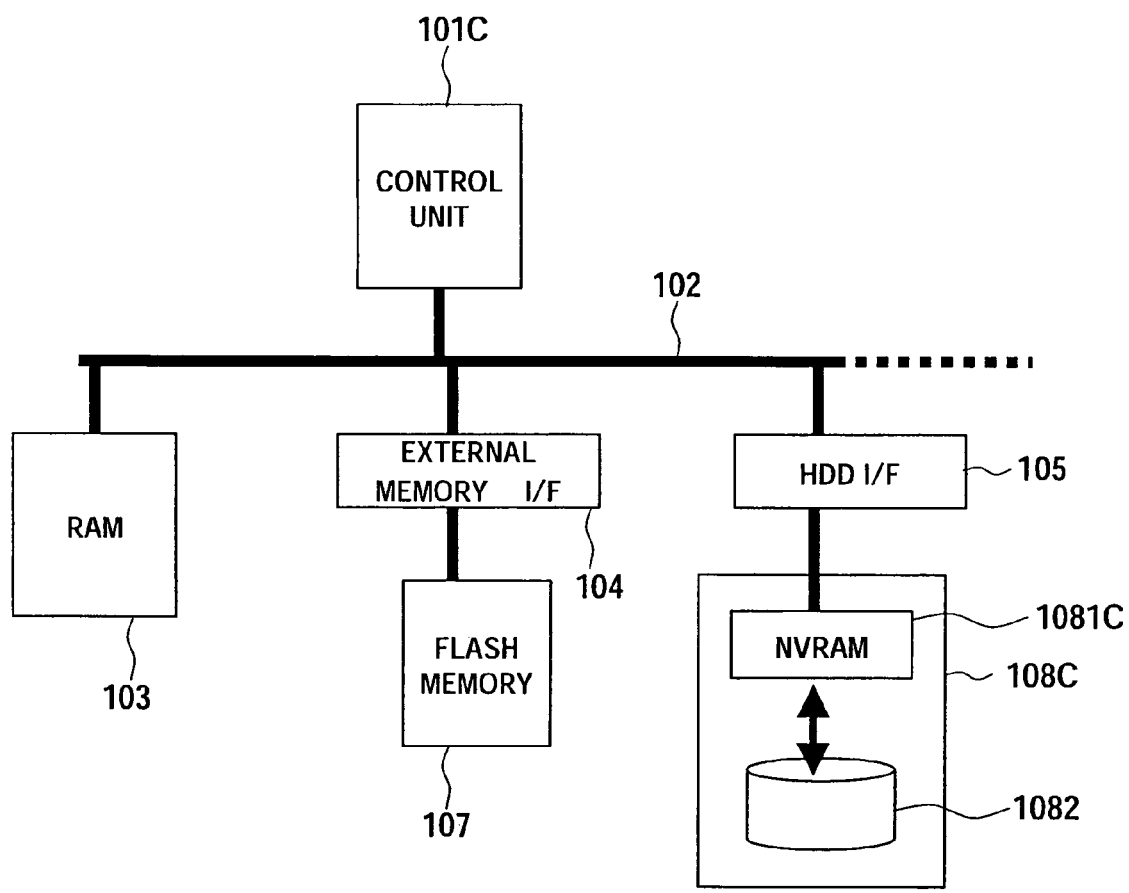
FIG. 11 is a block diagram of an example of the configuration of a file storage apparatus according to yet another embodiment of the present invention.

FIG. 11 is a block diagram of an example of the configuration of a file storage apparatus according to a fourth embodiment of the present invention.

The file storage apparatus illustrated in FIG. 11 has a control unit 101C, a RAM 103, an NVRAM 106, a flash memory 107, an HDD 108C, an external memory interface unit 104, and an HDD interface unit 105. Further, the HDD 108C has a nonvolatile cache memory 1081C and a hard disk 1082. Note that the same notations of FIG. 1 and FIG. 2 and FIG. 11 show the same components.

The file storage apparatus shown in FIG. 11 lacks the NVRAM 107 for storing the log data of the file storage apparatus shown in FIG. 1 and replaces the HDD 108 by the HDD 108C. Further, the HDD 108C is obtained by replacing the volatile cache memory 1081 of the HDD 108 by the nonvolatile cache memory 1081C such as an NVRAM.

In the HDD 108C, the cache memory 1081C is nonvolatile, therefore if data is once transferred to the inside thereof, the internal data will not be lost even if the power supply fails at any time. Namely, the entire HDD 108C including the cache memory 1081C can be regarded as an integral nonvolatile storage medium.

Figure 12:
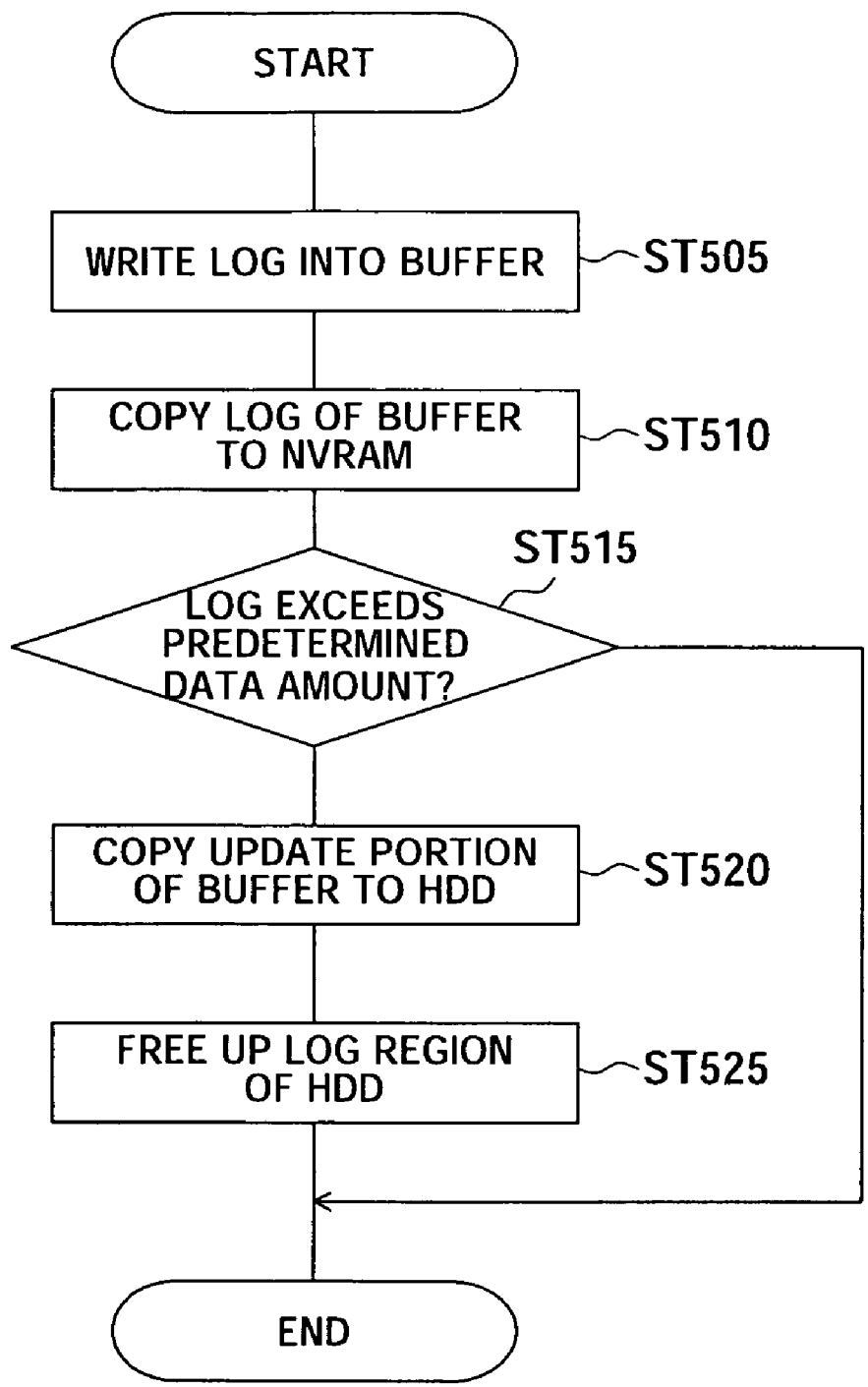
FIG. 12 is a flow chart illustrating an example of the flow of the processing of updating a file of the HDD in the file storage apparatus shown in FIG. 11.

Next, an explanation will be given of a file update operation of the file storage apparatus shown in FIG. 11 having the above configuration by referring to FIG. 12 and FIG. 13. FIG. 12 is a flow chart illustrating an example of the flow of the processing for updating a file in the HDD 108C in the file storage apparatus shown in FIG. 11. Further, FIG. 13 is a diagram illustrating a series of states of the update of a file and the meta data thereof in the file storage apparatus shown in FIG. 11. The same notations of FIG. 11 and FIG. 13 show the same components.

First, when the control unit 101C accesses the file of the HDD 108, it allocates the memory regions 10, 11, and 25 for the buffers of the log data, the meta data, and the file body to the system memory constituted by the RAM 103. The log data is stored in the buffer 10, the management information of the file constituted by the meta data is stored in the buffer 11, and the file body is stored in the buffer 25. Further, the control unit 101C allocates log data storage regions different from the usual file storage regions onto the HDD 108C.

Referring to FIG. 13A, when starting access to the HDD 108C, the control unit 101C reads out the data of the HDD 108C to the above buffer if required. Due to this, the meta data is read out to the buffer 11, and the file body is read out to the buffer 25 from the HDD 108. Both of them are comprised by sets of the file sectors.

Referring to FIG. 13B, assume that in this state a rewrite operation is applied to a certain file of the HDD 108C. In this case, the control unit 101C updates the sector group 16 of the file body buffer 25 and updates also the meta data 14 and 15 for managing the same. Further, the control unit 101C generates log data 13 including copies 17 and 18 of the updated meta data 14 and 15 and writes this into the log buffer 10 (step ST505).

Referring to FIG. 13C, further assume that a certain file of the EDD 108 is erased. The erasure of a file is usually carried out by only a change of the meta data. In this case, the control unit 101C updates the meta data 20, 21, and 22 of the meta data buffer region 11 and adds the log data 19 including the copy thereof to the log buffer 10 (step ST505).

Further, the control unit 101C transfers the log data 13 and 19 of the log buffer 10 to the log storage region of the HDD 108C here and writes the same as copies 23 and 24 of the log data (step ST510). What is important here is that a collection of log data is always generated for every file access and stored in the HDD 108C serving as the nonvolatile storage medium previous to the corresponding meta data. Due to this, even if trouble such as a power supply abnormality occurs during file access, based on the log data remaining in the cache memory 1081C or the hard disk 1082, it becomes possible to restore the integrity of the meta data stored in the hard disk 1082.

Note that, it is also possible to copy the log data from the log buffer 10 to the HDD 108C whenever a file access occurs or copy it when the number of file accesses, the amount of the log data stored in the log buffer 10, the elapsed time from the previous copying, etc. exceed predetermined threshold values. The higher the frequency of copying the log data to the HDD 108C, the nearer the newest log data the log data of the hard disk 1082 can be restored to after returning from the end of an abnormality.

Once the log data is written into the HDD 108C, the log data of the log buffer 10 corresponding to this can be deleted too.

FIG. 13D shows a state after a further file is accessed from the above state. The log data stored in the log buffer 10 is copied to the HDD 108C at the proper time, and the log data copied from is deleted from the log buffer 10. On the other hand, in the meta data buffer 11, sectors which have been already stored in the HDD 108C and sectors which have not been stored are mixed.

Referring to FIG. 13E, the control unit 101C monitors whether or not the log data stored in the log storage region of the HDD 108C exceeds a predetermined amount (step ST515). When it exceeds this, it starts to free up this log storage region (steps ST520 to ST525). For example, when for example the accumulated log data reaches a certain ratio of the entire capacity of the log storage region, the free-up of the log storage region is started.

First, after the control unit 101C confirms that no unstored log data exists in the log buffer 10, it writes all of the data in a sector of the meta data buffer 11 which have been updated but have not been stored in the HDD 108C (step ST520). At this time, it is also possible to write the amount of the update of the file body stored in the buffer 25 into the HDD 108C.

Referring to FIG. 13F, when the writing of the data from the buffer of the RAM 103 into the HDD 108 is completed, the control unit 101C frees up the log storage region 12 of the HDD 108C (step ST525). Due to this, a new file operation and accumulation of log data become possible.

Note that, in the above example, the entire area of the log storage region of the HDD 108C was freed up all together, but it is also possible to sequentially free up parts of the region in accordance with the stored meta data.

As explained above, according to the file storage apparatus according to the present embodiment, both of the cache memory 1081C and the hard disk 1082 have a nonvolatile property. Therefore, even if a write operation is stopped in the middle due to trouble such as a power supply abnormality, no log data will be lost. Accordingly, it becomes possible to update the meta data of the hard disk 1082 based on the log data remaining in them and the update use meta data and restore the integrity of the meta data stored in this.

Further, in the file storage apparatus according to the first embodiment, in FIG. 4E, after transferring the updated unstored meta data to the HDD 108, the processing for freeing up the cache memory 1081 of the HDD 108 was carried out, but the nonvolatile cache memory 1081C holds the data even after the power supply fails, so such processing is not necessary in the present embodiment. Accordingly, it becomes possible to reduce the processing procedures and speed up the access of a file.

The hard disk 1082 of the HDD 108C is always accessed via the nonvolatile cache memory 1081C. Therefore, unless uncertainty occurs in the cache memory 1081C, even if uncertainty occurs in the hard disk 1082, this will not cause a problem. This is because even if the power supply fails when data is written from the cache memory 1081C into the hard disk 1082, if data not including uncertainty remains on the writing side cache memory 1081c, by overwriting this data on the hard disk 1081 at the time of the next startup, the uncertainty on the hard disk 1082 can be eliminated. For example, the write control unit 1083 of the HDD 108C checks whether or not writable data remains in the cache memory 1081C in the startup processing and, when it remains, performs the processing for writing this data into the hard disk 1082. Due to this, unless uncertainty occurs in the cache memory 1081C, the uncertainty on the hard disk 1082 is eliminated.

The method of preventing the occurrence of uncertainty in the cache memory 1081C is the same as the third embodiment explained above. Namely, when an abnormality of the power supply voltage is detected during a write operation, in the cache memory 1081C, the write operation of a block which was carried out up to the middle is completed by using the very little charge remaining in the parasitic capacitor etc. of the substrate, and the access thereafter is prohibited. In a destructive reading type NVRAM, when an abnormality of the power supply voltage is detected during a read operation, the data is reliably read out to the sense amplifier by using the very little charge remaining in the parasitic capacitor etc. of the substrate, the operation up to the rewrite to the memory of the reading side is completed, then access after that is prohibited.

Further, the HDD 108C can have a function of suitably changing the write sequence from the cache memory 1081C to the hard disk 1082 and speeding up of the write operation as well. Namely, it is also possible if the write control unit 1083 performs control to suitably change the write sequence of data so as to shorten the delay of the write operation due to the wait time of the movement of the head and the wait time of the disk rotation etc. and speed up the write operation to the hard disk 1082. Due to this, the write speed can be further raised.

Note that the present invention is not limited to the above embodiments. Various modifications are possible.

In the file storage apparatus shown in FIG. 1, the NVRAM 106 may be a device able to perform random access in units of bytes or may be a block device in the same way as an HDD.

Further, in the file storage apparatus shown in FIG. 1, FIG. 7, and FIG. 11, the example of using an HDD as the main storage device of the files was shown, but the present invention is not limited to this. Various disk media can be used for this, for example, an optical disk such as a DVD and an magnetic-optical disk such as an MO. Alternatively, a semi-conductor memory such as a flash memory can be used for this as well.

In the file storage apparatus shown in FIG. 1 and FIG. 7, the example of using an NVRAM as the storing means for storing the log data was shown, but the present invention is not limited to this. For example, as explained next, a flash memory and a SRAM supplied with power by a battery can be used in place of an NVRAM.

A flash memory is cheap in comparison with an NVRAM, but cannot be said to be sufficiently faster than a disk medium. A flash memory does not perform a mechanical seek as in an HDD, but a long erasure process is necessary for a rewrite operation and the speed of writing is not as high as an NVRAM. Further, in order to secure the freshness of the meta data, preferably the log data is frequently stored in the non-volatile memory, but the rewrite durability of a flash memory is about 100,000 times, so a flash memory is not sufficient for this purpose.

The next best countermeasure for such problems is to erase the entire area of this storage region all together when freeing up the storage region of the log and to store the log data thereafter by addition not accompanied with erasure until the accumulated log data exceeds a certain amount of data. By this, the erasure time can be reduced and a certain improvement of the write speed can be expected. Further, the number of rewrites can be kept to the lowest limit.

Further, after freeing up the log storage region, if the new log storage region is secured at a place different from that of the previous time, the stress of rewriting can be relieved, and the service life can be prolonged. Further, by adding the log data by blocks in units of bytes and units of words having shorter data lengths than the identification code, the reconstruction of meta data by log data including the uncertain blocks can be prevented.

However, the write speed of a flash memory is still slower by two to three orders compared with an NVRAM, so a reduction in the performance cannot be avoided. Further, in a flash memory, performing the writing in byte units or other fine units further lowers the transfer efficiency and further degrades the performance. Namely, even if a flash memory is used for storing log data, the effect of preventing nonintegrity of the meta data can be obtained, but when considering the write speed and lifetime, an NVRAM is more desirable than a flash memory for storing log data. However, when it is difficult to employ an NVRAM due to cost restrictions, a certain improvement is possible even with a flash memory to which the above countermeasure is applied.

A function the same way as that of an NVRAM can also be realized by a battery-backed up SRAM. However, an SRAM needs six transistors for storing one bit, so is more expensive than an NVRAM. Also, maintenance of the backup battery is necessary. An SRAM can be accessed at a higher speed than any other memory, but particularly in applications of the first embodiment, the storing means used for storing the log data need only be sufficiently faster than the disk medium etc. storing the meta data. An NVRAM has the required sufficient performance. Further, in the second embodiment, in almost all cases, the storing means used in the system memory of the computer is a DRAM. Particularly, an FeRAM or MRAM can provide the required performance. Accordingly, desirably an NVRAM is used from both the viewpoints of cost and maintenance. Note that a certain degree of risk is involved when introducing a relatively new technique like an NVRAM, therefore, as a provisional measure considering transition to an NVRAM in the future, a case of introducing a battery backed-up SRAM may be possible.

Further, in the file storage apparatus shown in FIG. 11, the example of using an NVRAM as a cache memory is shown, but the present invention is not limited to this. It is also possible to use an SRAM supplied with power by for example a battery in place of an NVRAM. As explained above, however, an SRAM requires six transistors for storing one bit, so is more expensive than an NVRAM. Also, maintenance of the backup battery is necessary. An SRAM can be accessed at a higher speed than any other memory, but the cache memory used in an HDD etc. need only be sufficiently higher in speed than a disk medium etc. thereof. An NVRAM has the required sufficient performance. Accordingly, desirably an NVRAM is used from both of the viewpoints of the cost and maintenance. Note that as a provisional measure considering transition to an NVRAM in mind, the case of introducing a battery-backed up SRAM is also possible.

While the invention has been described with reference to specific embodiments chosen for purpose of illustration, it should be apparent that numerous modifications could be made thereto by those skilled in the art without departing from the basic concept and scope of the invention.

What is claimed is:

1. A file storage apparatus for storing a file and management information of the file and reconstruction information of the management information, comprising:
 a first storage means for storing the file and the management file,
 wherein the first storage means includes a first volatile memory for temporarily storing data of the file, and a first non-volatile memory for storing data of the file being read out from the first volatile memory;
 a second non-volatile memory connected with the first storage means and for storing the reconstruction information;
 a second volatile memory;
 control means for controlling the first storage means and the second non-volatile memory to perform data write operations of the file, the management information, and the reconstruction information,
 wherein the reconstruction information includes a copy of an updated block of meta data of the file without including all of the meta data of the file, and
 wherein upon each access to the file, the control means writes the reconstruction information to the second non-volatile memory before writing an updated management information to the first storage means and the control means removes the reconstruction information from the second non-volatile memory after the updated management information is written to the first non-volatile memory; and
 power supply voltage monitoring means for monitoring a normal state or an abnormal state of a power supply voltage,
 wherein the control means divides the reconstruction information into a plurality of blocks, attaches, to an end of the reconstruction information, a predetermined code representing a completion of writing the reconstruction information to the second non-volatile memory and provides the plurality of blocks to the second non-volatile memory in order from the beginning of the plurality of blocks,
 wherein the second non-volatile memory completes writing a first block of the plurality of the blocks when the power supply voltage monitoring means detects the abnormal state of the power supply during the write operation of the first block, and the power supply voltage monitoring means inhibits writing a second block following the first block,
 wherein the control means assigns storage regions in the second volatile memory for storing the management information and the reconstruction information, and
 wherein upon each update of the file, the control means writes the updated management information to the storage region of the management information assigned to the second volatile memory, writes the reconstruction information corresponding to the update to the storage region of the reconstruction information assigned to the second volatile memory, copies the reconstruction information written in the storage region of the second volatile memory to the second non-volatile memory, and rewrites the updated management information written in the second volatile memory to the first non-volatile memory.

2. The file storage apparatus according to claim 1, wherein the second non-volatile memory performs the data write operation faster than that of the first storage means.

3. The file storage apparatus according to claim 2, wherein the first non-volatile memory includes a disk medium or a flash memory, and the second non-volatile memory includes a non-volatile type semiconductor memory.

4. The file storage apparatus according to claim 3, wherein the second non-volatile memory includes any one of a ferroelectric random access memory (FeRAM), a magnetic RAM (MRAM), an ovonic unified memory (OUM) and a resistance RAM (RRAM).

5. The file storage apparatus according to claim 1, wherein the second non-volatile memory includes a FeRAM.

6. The file storage apparatus according to claim 1, wherein a length of each block is shorter than that of the predetermined code.

7. The file storage apparatus according to claim 1, wherein, when the data amount of the reconstruction information stored in the second non-volatile memory exceeds a predetermined value, the control means writes the management information corresponding to the reconstruction information to the first non-volatile memory, requests a free-up of the first volatile memory of the first storage means, and removes the reconstruction information in the second non-volatile memory upon receipt of a free-up completion notice responsive to the request, and wherein the first storage means writes the data remaining in the first volatile memory to the first non-volatile memory when the control means detects that the data amount of the reconstruction information stored in the second non-volatile memory exceeds the predetermined value and sends a free-up request, and informs the completion of the free-up of the first volatile memory to the control means when completing the write operation of the data remained in the first volatile memory.

8. The file storage apparatus according to claim 1, wherein the control means writes the management information for update to the first storage means, requests a free-up of the first volatile memory of the first storage means, and removes the reconstruction information from the second non-volatile memory upon receipt of the notice of the completion of the free-up of the first volatile memory responsive to the request from the first storage means, and wherein the first storage means writes data remained in the first volatile memory to the first non-volatile memory when a free-up of the first volatile memory is requested by the control means, and informs the completion of the free-up of the first volatile memory to the control means when completing the write operation of the data remained in the first volatile memory.

9. The file storage apparatus according to claim 1, wherein the control means requests a free-up of the first volatile memory to the first storage means for terminating operation, and frees up the second non-volatile memory upon receipt of a notice of a completion of the free-up of the first volatile memory and wherein the first storage means writes the data remained in the first volatile memory to the first non-volatile memory upon the terminating operation, and informs the completion of the free-up of the first volatile memory to the control means upon completion of the write operation of the data remained in the first volatile memory.

10. The file storage apparatus according to claim 1, wherein the control means checks whether the reconstruction information is stored in the second non-volatile memory in a start-up process, and updates the management information to be stored to the first storage means on the basis of the stored reconstruction information.

11. The file storage apparatus according to claim 1, wherein the control means stores a part of information for a start-up process to a part of empty regions of the second non-volatile memory.

12. The file storage apparatus according to claim 1, wherein:

the first non-volatile memory includes a disk medium,
the second non-volatile memory includes a flash memory, and
the control means erases data in a predetermined region for storing the reconstruction information in the flash memory upon receipt of notification that a free-up of the first volatile memory is complete.

13. The file storage apparatus according to claim 1, wherein:

the first non-volatile memory includes a disk medium or a flash memory, and
the second non-volatile memory includes a random-accessible and volatile semiconductor memory supplied with a power supply of a battery.

14. A file storage apparatus for storing a file and management information of the file and reconstruction information of the management information, comprising:

a storage unit including a first non-volatile memory for temporarily storing data to be stored, and a second non-volatile memory for storing the data from the first non-volatile memory;

a volatile memory;

control means for controlling the storage unit to perform data write operations of the file, the management information, and the reconstruction information, wherein the reconstruction information includes a copy of an updated block of a meta data of the file without including all of the meta data of the file, and wherein upon each access to the file, the control means writes the reconstruction information for an updated management information to the first non-volatile memory before writing the updated management information to the second non-volatile memory and the control means removes the reconstruction information for the updated management information from the first non-volatile memory after the updated management information is written to the second non-volatile memory; and power supply voltage monitoring means for monitoring a normal state or an abnormal state of a power supply voltage, wherein the control means divides the reconstruction information into a plurality of blocks, attaches a predetermined code representing a completion of the write operation to an end thereof, and provides the plurality of blocks to a second storage unit in order from the beginning of the plurality of the blocks, and wherein the first non-volatile memory completes the write operation of a first block of the plurality of blocks when the power supply voltage monitoring means detects the abnormal state of the power supply during the write operation of the first block, and inhibiting the write operation of a second block following the first block, wherein the control means assigns storage regions in the volatile memory for storing the management information and the reconstruction information, and wherein upon each update of the file, the control means writes the updated management information to the storage region of the management information assigned to the volatile memory, writes the reconstruction information corresponding to the update to the storage region of the reconstruction information assigned to the volatile memory, copies the reconstruction information written in the storage region of the volatile memory to the second non-volatile memory, and rewrites the updated management information written in the volatile memory to the first non-volatile memory.

15. The file storage apparatus according to claim 14, wherein the first non-volatile memory includes a non-volatile semiconductor memory with a write speed faster than that of the second non-volatile memory.

16. The file storage apparatus according to claim 15, wherein the first non-volatile memory includes any one of a ferroelectric random access memory (FeRAM), a magnetic RAM (MRAM), an ovonic unified memory (OUM) and a resistance RAM (RRAM).

17. The file storage apparatus according to claim 14, wherein the storage unit includes a write control means for changing a sequence of the speed of the second non-volatile memory, when the data to be stored is written from the first non-volatile memory to the second non-volatile memory.

18. The file storage apparatus according to claim 14, wherein the storage means includes a write control means for checking the remaining of the data writable to the first non-volatile memory in the start-up process for initiating the operation, and writes the remained data to the second non-volatile memory when data remains.

19. The file storage apparatus according to claim 14, wherein:
the second non-volatile memory includes:
a disk medium or a flash memory, or a second storage unit including a random-accessible and volatile semiconductor memory supplied with a power supply.

* * * * *

UNITED STATES PATENT AND TRADEMARK OFFICE
CERTIFICATE OF CORRECTION

PATENT NO. : 7,640,388 B2  Page 1 of 1
APPLICATION NO. : 10/961299
DATED : December 29, 2009
INVENTOR(S) : Nakashima et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 513 days.

Signed and Sealed this

Ninth Day of November, 2010

David J. Kappos
*Director of the United States Patent and Trademark Office*